US010043886B2

(12) United States Patent
Chang et al.

(10) Patent No.: US 10,043,886 B2
(45) Date of Patent: Aug. 7, 2018

(54) METAL GATE FORMATION THROUGH ETCH BACK PROCESS

(71) Applicant: Taiwan Semiconductor Manufacturing Company, Ltd., Hsin-Chu (TW)

(72) Inventors: Che-Cheng Chang, New Taipei (TW); Chih-Han Lin, Hsin-Chu (TW); Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/366,268

(22) Filed: Dec. 1, 2016

(65) Prior Publication Data

US 2018/0040715 A1     Feb. 8, 2018

Related U.S. Application Data

(60) Provisional application No. 62/370,619, filed on Aug. 3, 2016, provisional application No. 62/405,410, filed on Oct. 7, 2016.

(51) Int. Cl.
| | |
|---|---|
| *H01L 29/66* | (2006.01) |
| *H01L 21/3213* | (2006.01) |
| *H01L 21/027* | (2006.01) |
| *H01L 21/285* | (2006.01) |
| *H01L 29/78* | (2006.01) |
| *H01L 21/8234* | (2006.01) |
| *H01L 27/088* | (2006.01) |

(52) U.S. Cl.
CPC .... *H01L 29/66545* (2013.01); *H01L 21/0273* (2013.01); *H01L 21/28556* (2013.01); *H01L 21/32133* (2013.01); *H01L 21/823431* (2013.01); *H01L 21/823437* (2013.01); *H01L 27/0886* (2013.01); *H01L 29/6656* (2013.01); *H01L 29/7851* (2013.01)

(58) Field of Classification Search
CPC ......... H01L 29/66545; H01L 29/66871; H01L 29/66606; H01L 21/823437
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |

(Continued)

FOREIGN PATENT DOCUMENTS

TW            201301444 A        1/2013

*Primary Examiner* — Phat X Cao
(74) *Attorney, Agent, or Firm* — Slater Matsil, LLP

(57) ABSTRACT

A method includes forming a dummy gate stack over a semiconductor region, forming a dielectric layer at a same level as the dummy gate stack, removing the dummy gate stack to form an opening in the dielectric layer, filling a metal layer extending into the opening, and etching back the metal layer, with remaining portions of the metal layer having edges lower than a top surface of the dielectric layer. The opening is filled with a conductive material, and the conductive material is over the metal layer. The metal layer and the conductive material in combination form a replacement gate. A source region and a drain region are formed on opposite sides of the replacement gate.

20 Claims, 27 Drawing Sheets

(56) References Cited

U.S. PATENT DOCUMENTS

| | | |
|---|---|---|
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,748,350 B2 * | 8/2017 | Hsieh ................ H01L 29/42376 |
| 2007/0262451 A1 * | 11/2007 | Rachmady ........ H01L 21/28088 257/758 |
| 2010/0065926 A1 * | 3/2010 | Yeh ................... H01L 21/28105 257/410 |
| 2012/0326238 A1 * | 12/2012 | Chien ............. H01L 21/823842 257/369 |
| 2013/0154022 A1 | 6/2013 | Chung et al. |
| 2013/0280900 A1 * | 10/2013 | Lai ................. H01L 21/823842 438/589 |
| 2014/0001574 A1 | 1/2014 | Chen et al. |
| 2014/0110755 A1 | 4/2014 | Colinge |
| 2014/0151812 A1 | 6/2014 | Liaw |
| 2016/0163601 A1 * | 6/2016 | Xie ................... H01L 21/28088 257/392 |
| 2017/0117190 A1 * | 4/2017 | Chung ............ H01L 21/823842 |

\* cited by examiner

METAL GATE FORMATION THROUGH ETCH BACK PROCESS

PRIORITY CLAIM AND CROSS-REFERENCE

This application claims the benefit of the following provisionally filed U.S. Patent applications: Application Ser. No. 62/370,619, filed Aug. 3, 2016, and entitled "Metal Gate Etch Back Process," and Application Ser. No. 62/405,410, filed Oct. 7, 2016, and entitled "Metal Gate Formation through Etch Back Process," which applications are hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to suit to the requirements of the NMOS devices and PMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
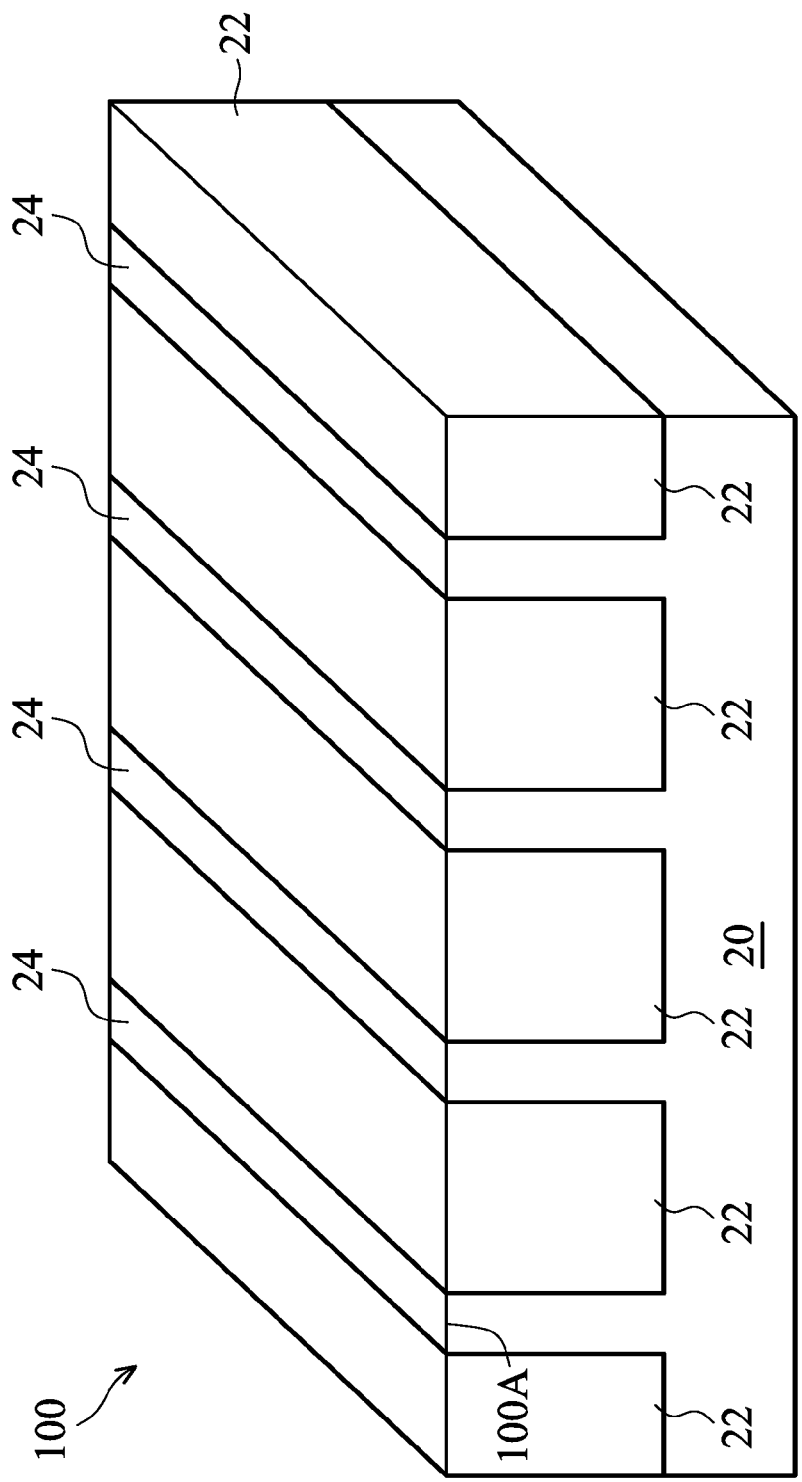
FIGS. 1 through 17 illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of a Fin Field-Effect Transistor (FinFET) is used an example to explain the embodiments of the present disclosure. Planar transistors may also adopt the concept of the present disclosure.

Figure 22:
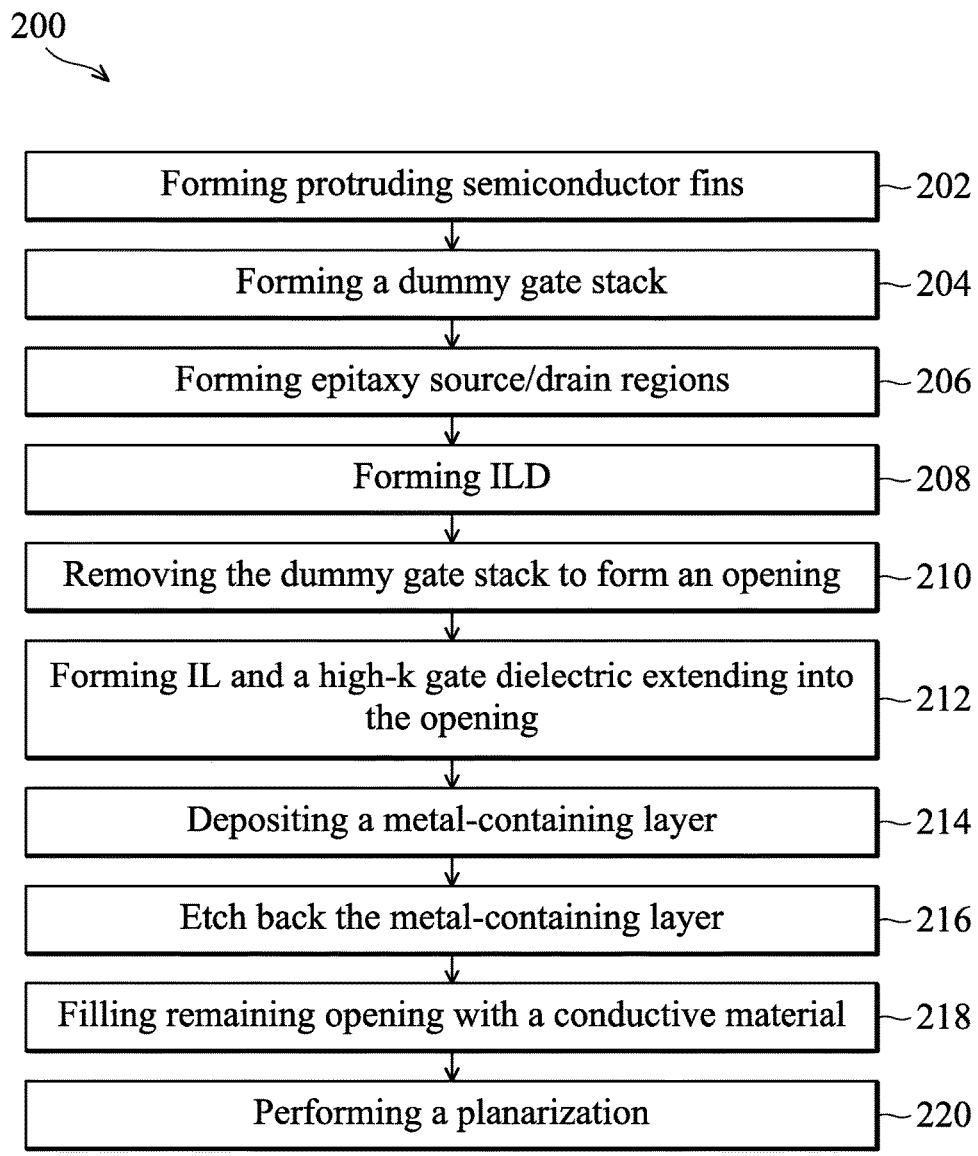
FIG. 22 illustrates a flow chart of a process for forming a FinFET in accordance with some embodiments.

FIGS. 1 through 17 illustrate the cross-sectional views and perspective views of intermediate stages in the formation of a FinFET in accordance with some embodiments of the present disclosure. The steps shown in FIGS. 1 through 17 are also reflected schematically in the process flow shown in FIG. 22.

FIG. 1 illustrates a perspective view of an initial structure. The initial structure includes wafer 100, which further includes substrate 20. Substrate 20 may be a semiconductor substrate, which may further be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed of Flowable Chemical Vapor Deposition (FCVD), spin-on, or the like.

Figure 2:
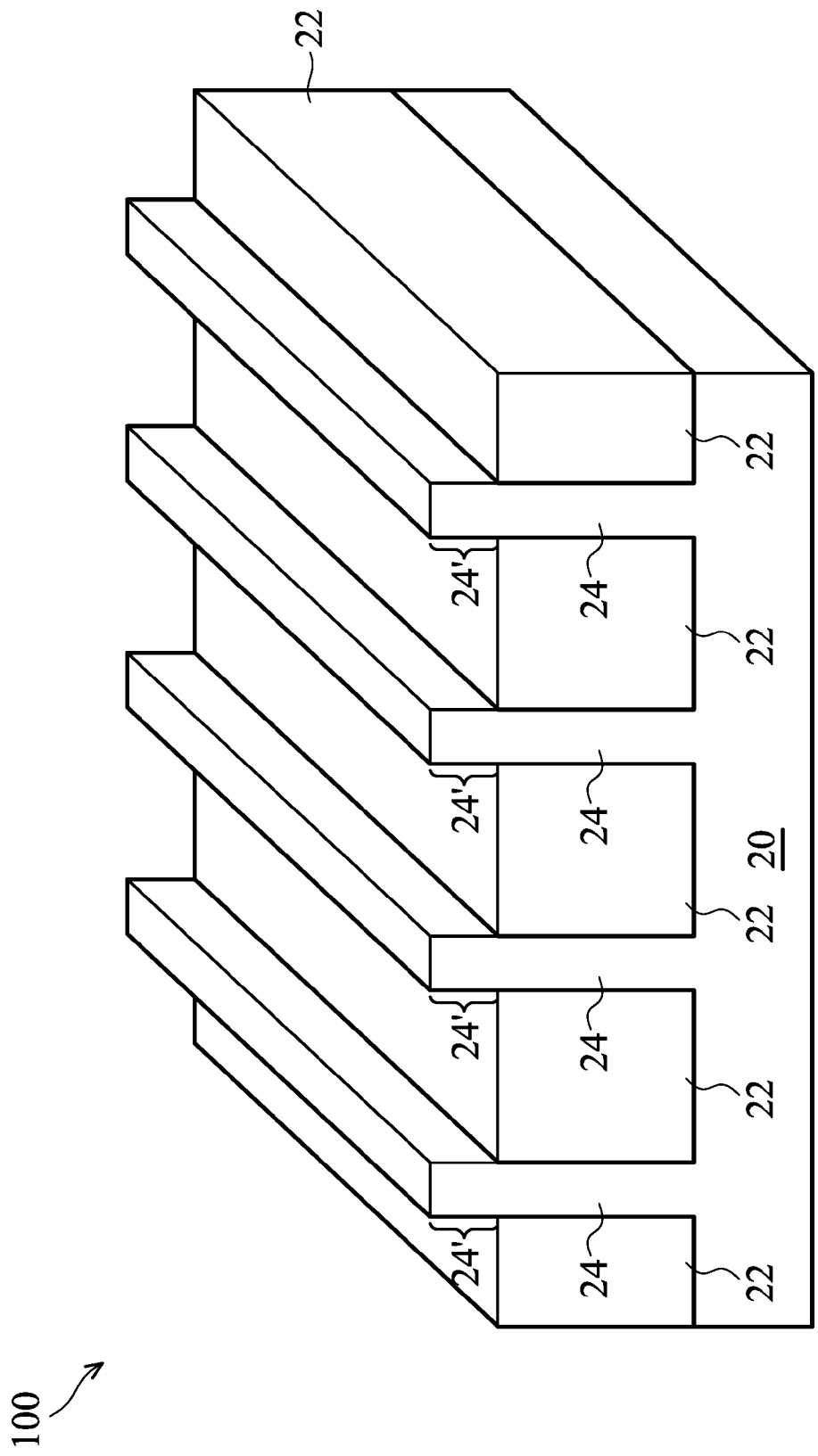

Referring to FIG. 2, STI regions 22 are recessed, so that top portions of semiconductor strips 24 protrude higher than the top surfaces of STI regions 22 to form protruding fins 24'. The respective step is illustrated as step 202 in the process flow shown in FIG. 22. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

Figure 3:
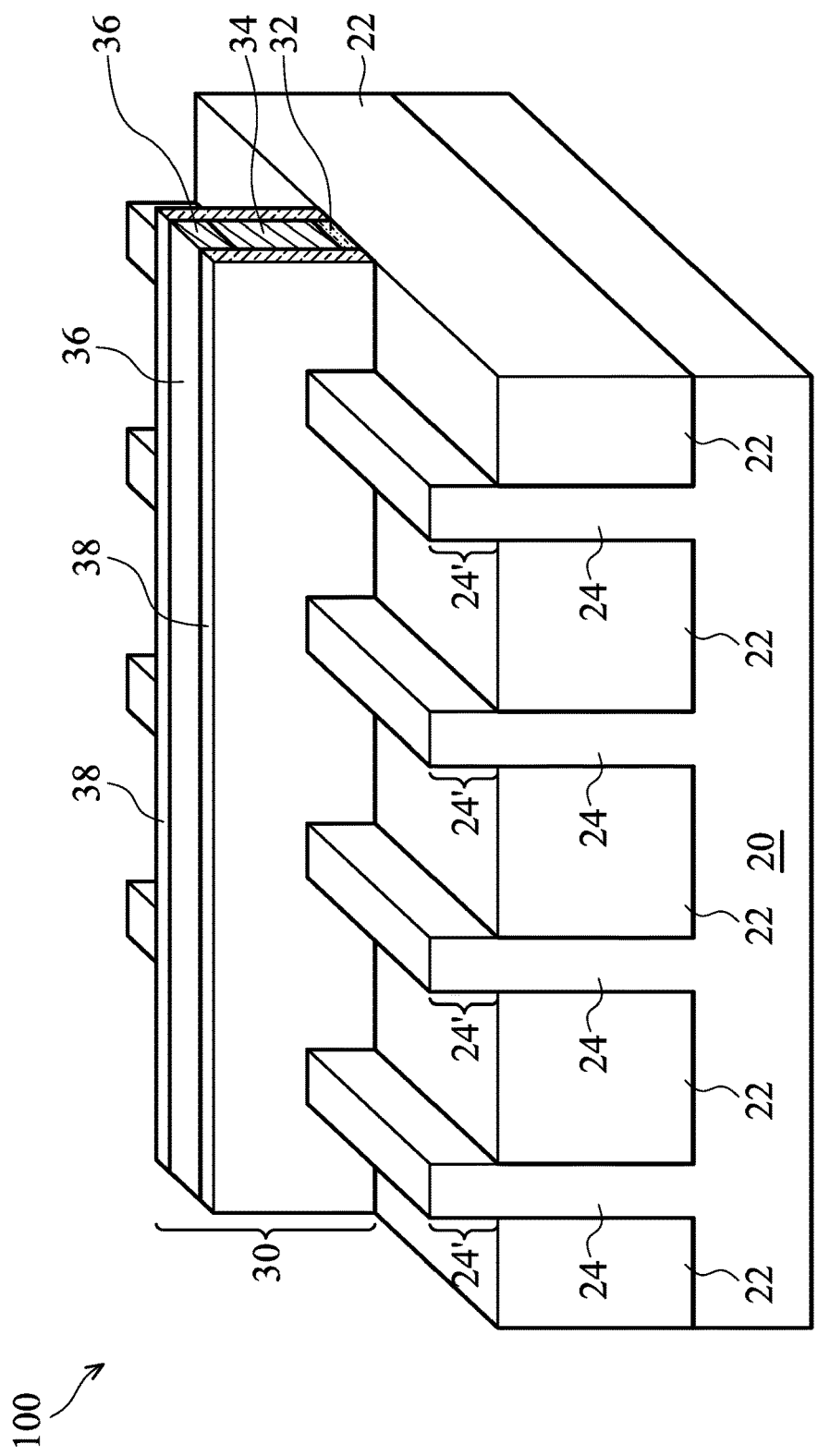

Referring to FIG. 3, dummy gate stack 30 is formed on the top surfaces and the sidewalls of protruding fins 24'. The respective step is illustrated as step 204 in the process flow shown in FIG. 22. Dummy gate stack 30 may include gate dielectric 32 and dummy gate electrode 34 over dummy gate dielectric 32. Dummy gate electrode 34 may be formed, for example, using polysilicon, and other materials may also be used. Dummy gate stack 30 may also include one (or a plurality of) hard mask layer 36 over dummy gate electrode 34. Hard mask layer 36 may be formed of silicon nitride, silicon carbo-nitride, or the like. Dummy gate stack 30 may cross over a single one or a plurality of protruding fins 24' and/or STI regions 22. Dummy gate stack 30 may also have a lengthwise direction substantially perpendicular to the lengthwise direction of protruding fins 24'.

Next, gate spacers 38 are formed on the sidewalls of dummy gate stack 30. In accordance with some embodiments of the present disclosure, gate spacers 38 are formed of a dielectric material such as silicon carbon-oxyitride (SiCN), silicon nitride, or the like, and may have a single-layer structure or a multi-layer structure including a plurality of dielectric layers.

Figure 4:
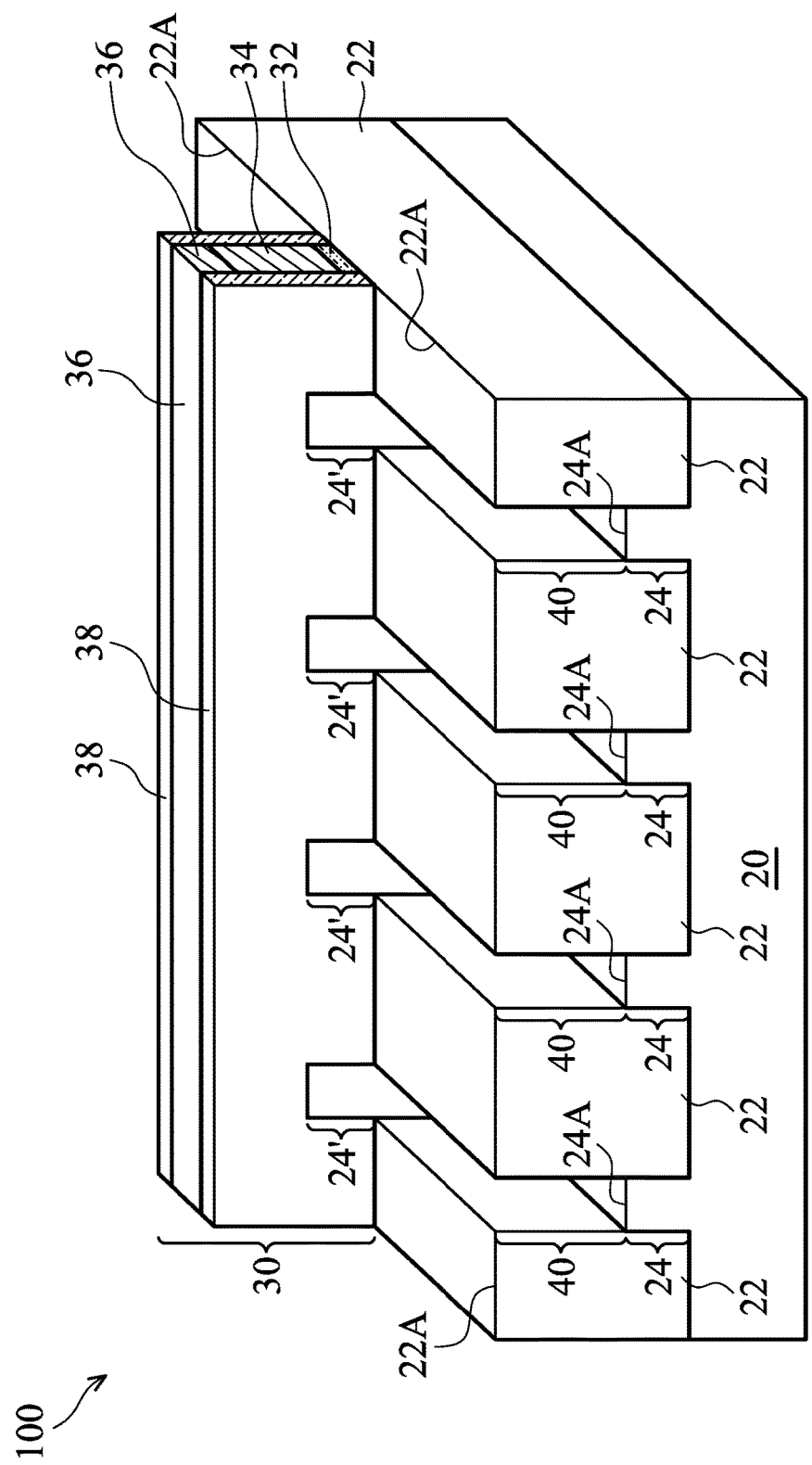

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
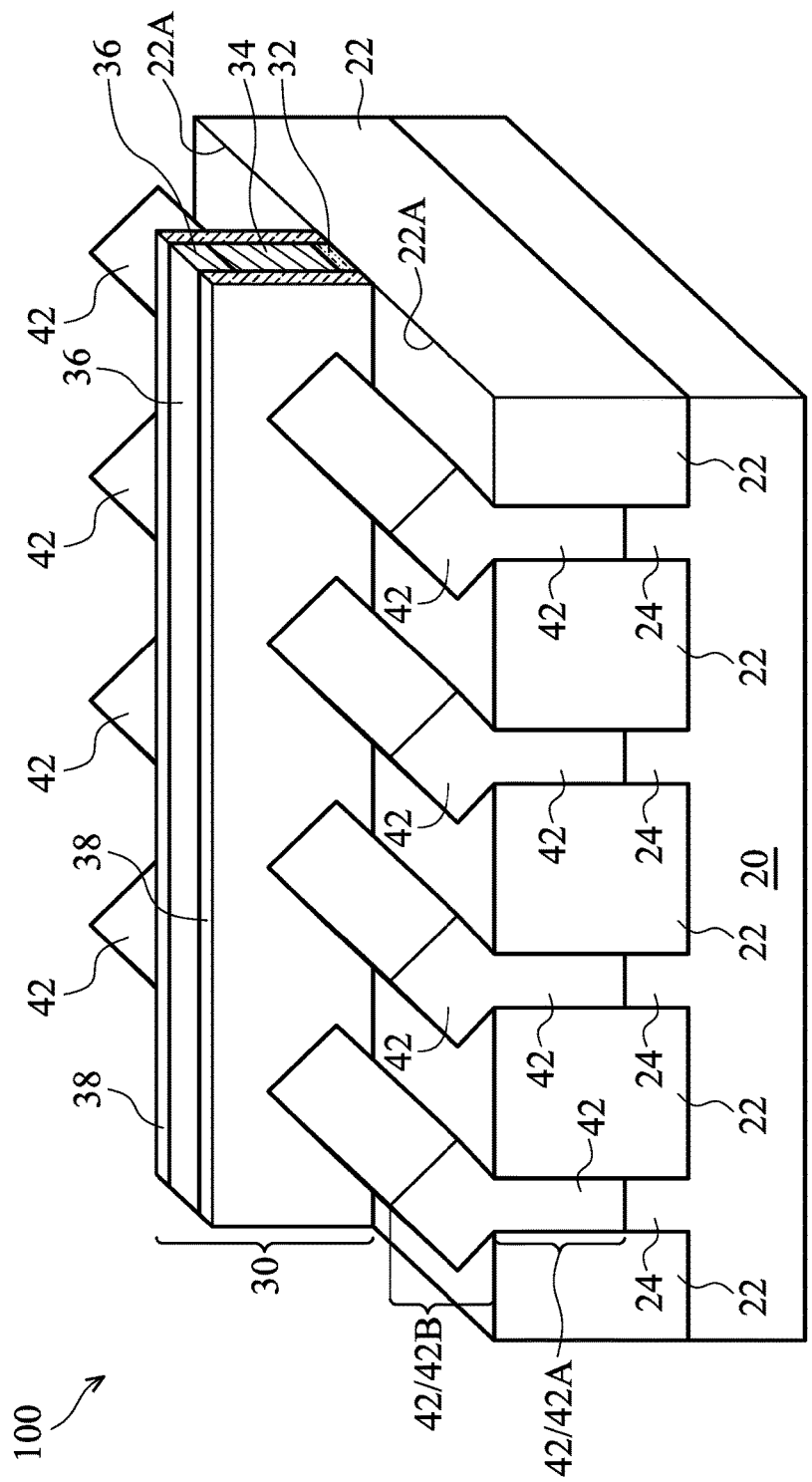

Next, epitaxy regions (source/drain regions) are formed by selectively growing a semiconductor material in recesses 40, resulting in the structure in FIG. 5. The respective step is illustrated as step 206 in the process flow shown in FIG. 22. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 causes epitaxy regions 42 to expand horizontally, and facets may be formed.

After the epitaxy step, epitaxy regions 42 may be further implanted with a p-type or an n-type impurity to form source and drain regions, which are also denoted using reference numeral 30. In accordance with alternative embodiments of the present disclosure, the implantation step is skipped since epitaxy regions 42 are in-situ doped with the p-type or n-type impurity during the epitaxy. Epitaxy regions 42 include lower portions 42A that are formed in STI regions 22, and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantial perpendicular to the major surfaces (such as bottom surface 20B) of substrate 20.

Figure 6:
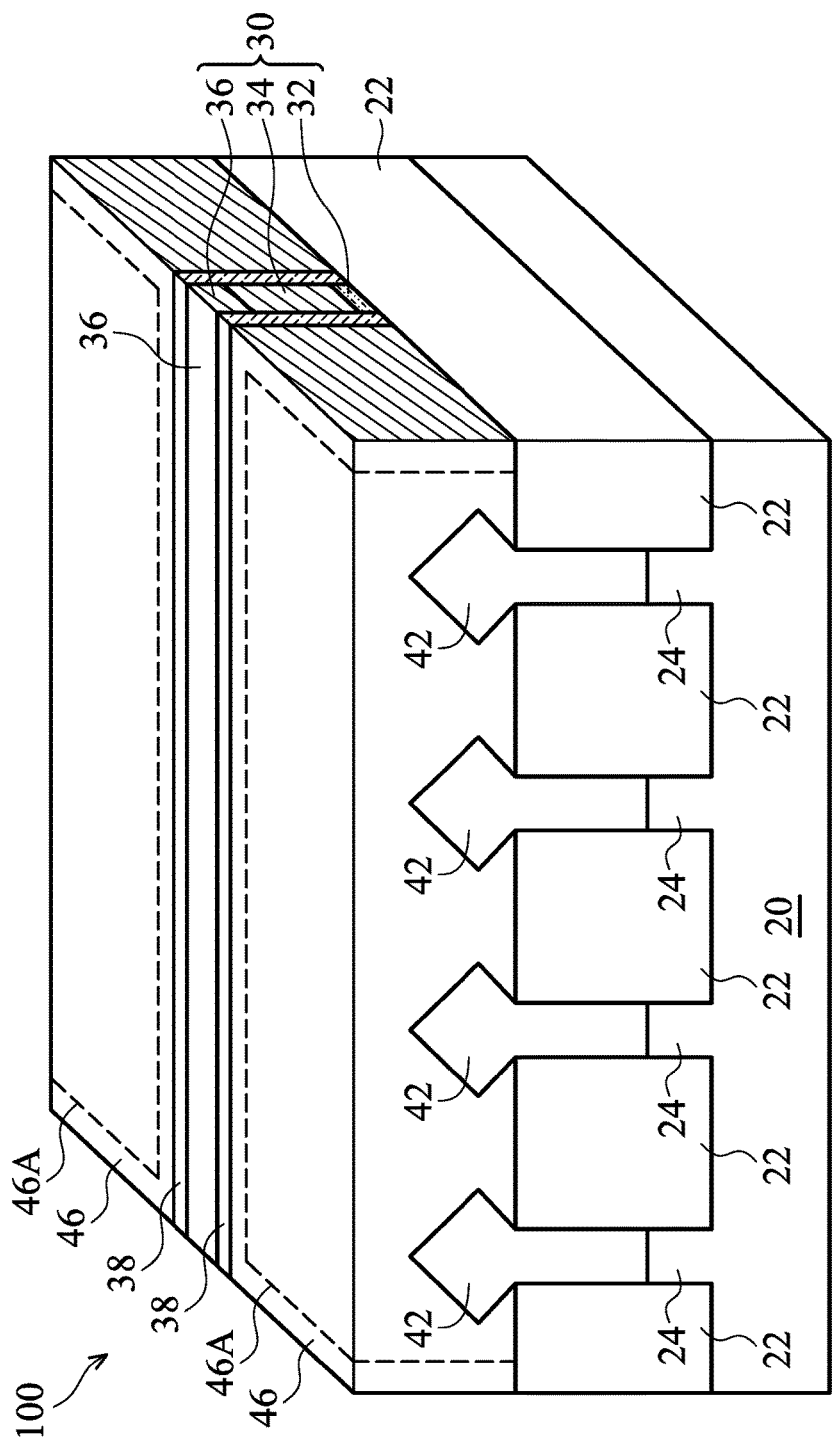

FIG. 6 illustrates a perspective view of the structure after Inter-Layer Dielectric (ILD) 46 is formed. The respective step is illustrated as step 208 in the process flow shown in FIG. 22. In accordance with some embodiments of the present disclosure, a buffer oxide layer (not shown) and a Contact Etch Stop Layer (CESL, not shown) are formed on source and drain regions 42 before the formation of ILD 46. The buffer oxide layer may be formed of silicon oxide, and the CESL may be formed of silicon nitride, silicon carbo-nitride, or the like. The buffer oxide layer and the CESL may be formed using a conformal deposition method such as Atomic Layer Deposition (ALD), for example. ILD 46 may include a dielectric material formed using, for example, FCVD, spin-on coating, CVD, or other deposition methods. ILD 46 may also be formed of Phospho-Silicate glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 46, dummy gate stack 30, and gate spacers 38 with each other.

In a subsequent step, portions 46A of ILD 46 are removed to form contact openings. Source/drain silicide regions 48 (FIG. 7A) are then formed on the surfaces of epitaxy regions 42. The formation process includes depositing a metal layer into the contact openings, and performing an anneal to react the metal layer with the exposed surface portions of epitaxy regions 42, so that silicide regions 48 are formed. In accordance with some embodiments, unreacted portions of the metal layer are removed. In accordance with alternative embodiments, the unreacted portions of the metal layer remain unremoved. A conductive material such as tungsten is then filled into the contact openings to form contact plugs 50, as shown in FIG. 7A.

Figure 7A:
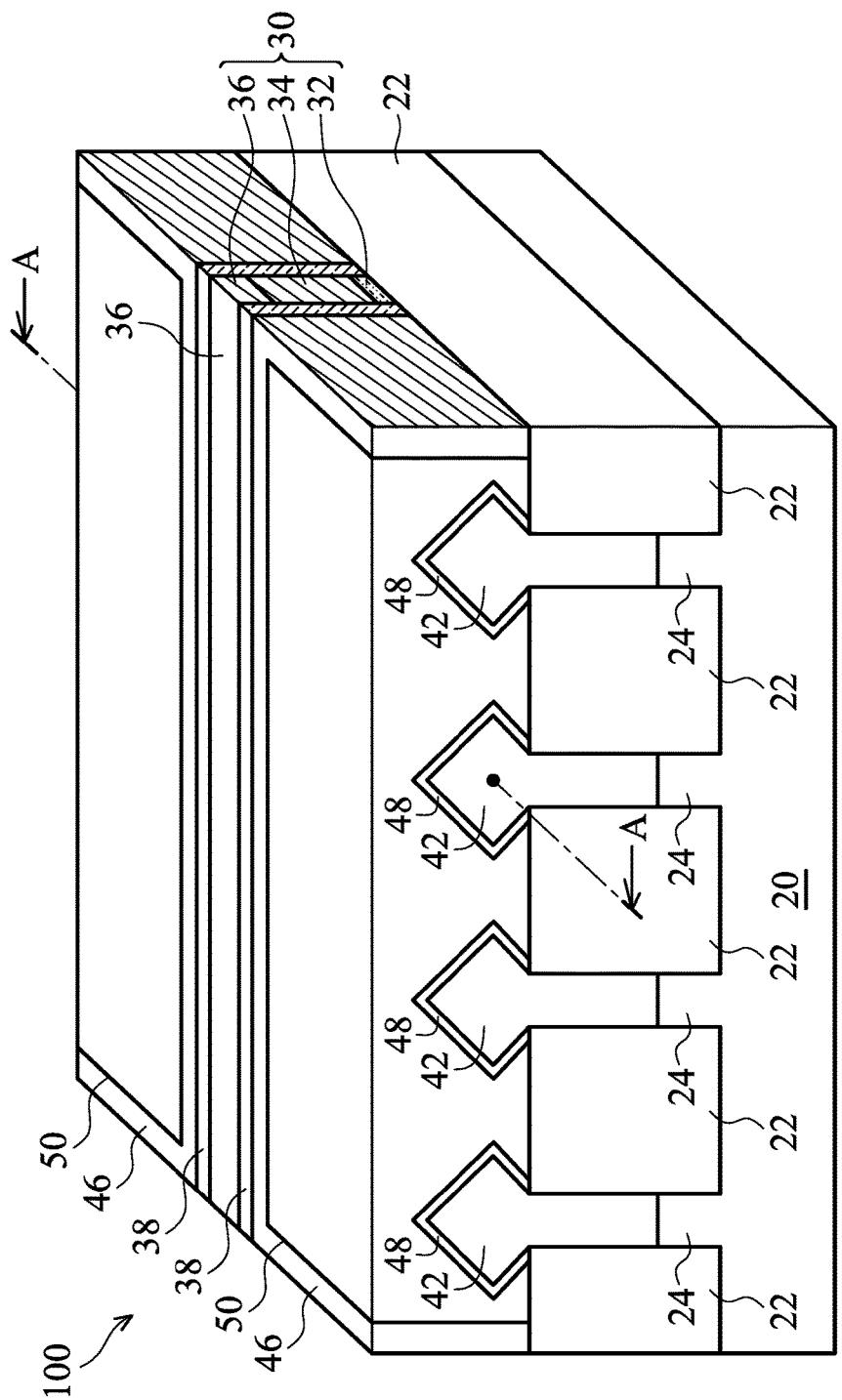
Figure 7B:
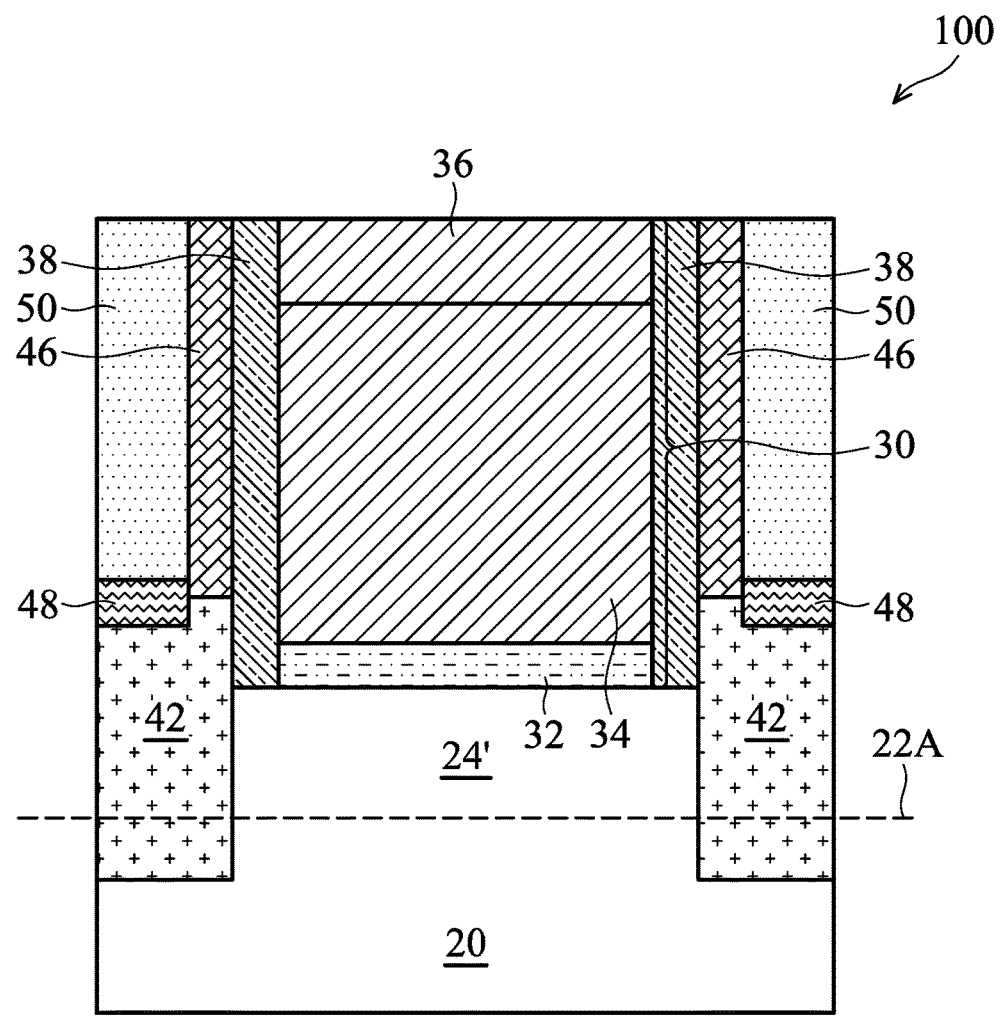

A cross-sectional view of the structure shown in FIG. 7A is illustrated in FIG. 7B, wherein the cross-sectional view is obtained from the vertical plane containing line A-A in FIG. 7A. Next, the dummy gate stack 30 including hard mask layer 36, dummy gate electrode 34 and dummy gate dielectric 32 are replaced with a metal gate and a replacement gate dielectric, as shown in FIGS. 8 through 16. The cross-sectional views shown in FIGS. 8 through 16 are obtained from the same vertical plane containing line A-A in FIG. 7. In FIGS. 8 through 16, the top surfaces 22A of STI regions 22 are illustrated, and semiconductor fins 24' are over top surface 22A.

Figure 8:
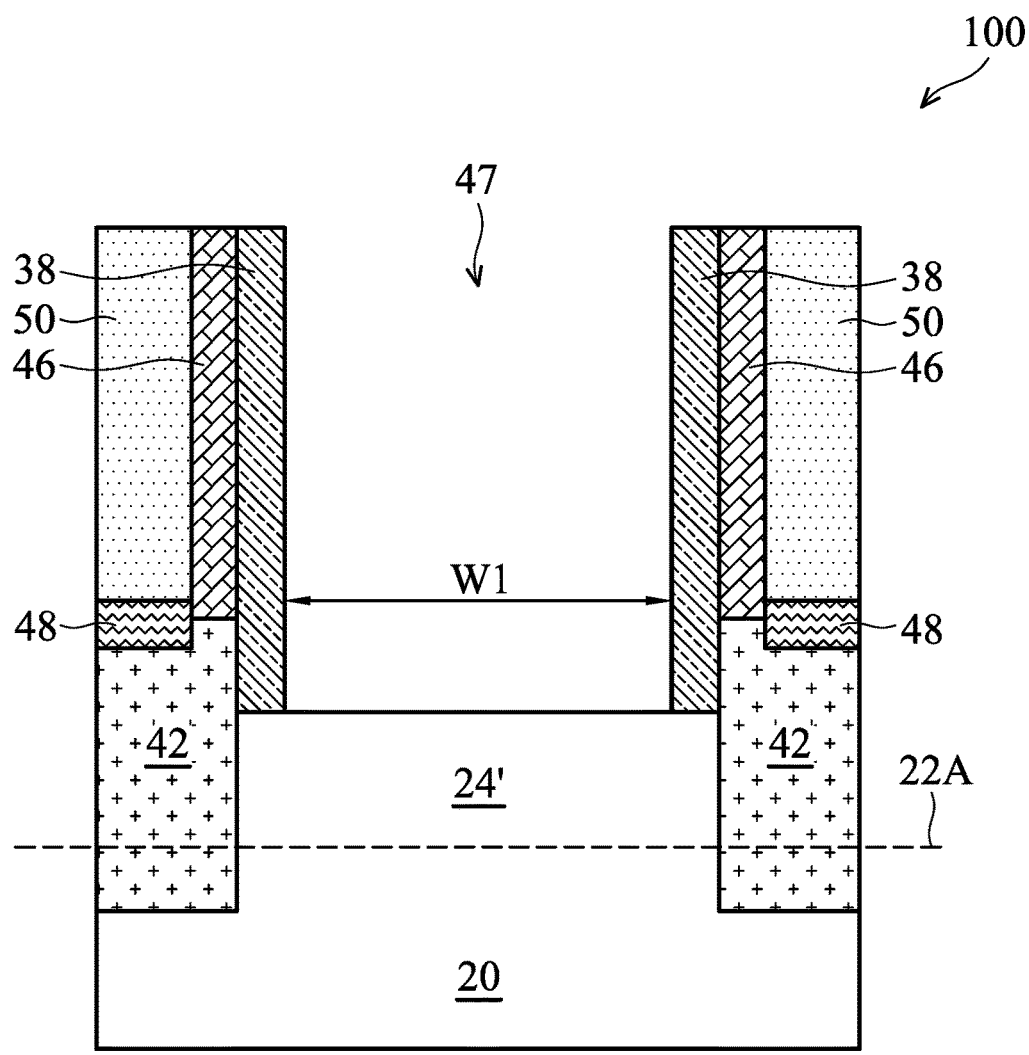

Hard mask layer 36, dummy gate electrode 34, and dummy gate dielectric 32 as shown in FIGS. 7A and 7B are then removed, forming opening 47 as shown in FIG. 8. The respective step is illustrated as step 210 in the process flow shown in FIG. 22. The top surfaces and the sidewalls of protruding fins 24' are exposed to opening 47.

Figure 9:
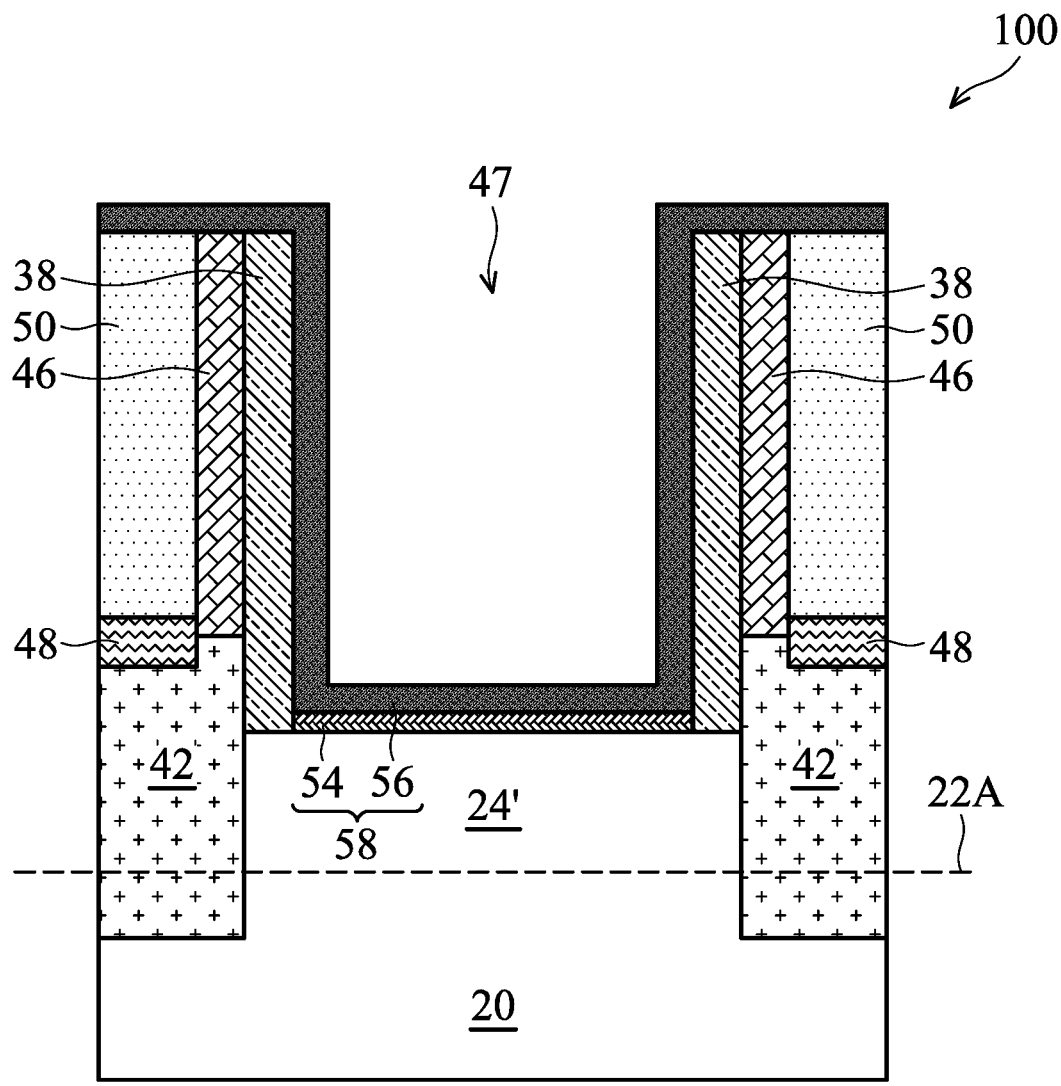

Next, referring to FIG. 9, gate dielectrics are formed, which extends into opening 47. The respective step is illustrated as step 212 in the process flow shown in FIG. 22. In accordance with some embodiments of the present disclosure, gate dielectric 58 includes Interfacial Layer (IL) 54 as its lower part. IL 54 is formed on the exposed surfaces of protruding fins 24'. IL 54 may include an oxide layer such as a silicon oxide layer, which is formed through the thermal oxidation of protruding fins 24', a chemical oxidation process, or a deposition process. Gate dielectric 58 may also include high-k dielectric layer 56 formed over IL 54. High-k dielectric layer 56 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 56 is overlying, and may contact, IL 54. High-k dielectric layer 56 is formed as a conformal layer, and extends on the sidewalls of protruding fins 24' and the top surface and the sidewalls of gate spacers 38. In accordance with some embodiments of the present disclosure, high-k dielectric layer 56 is formed using ALD or CVD.

Figure 10:
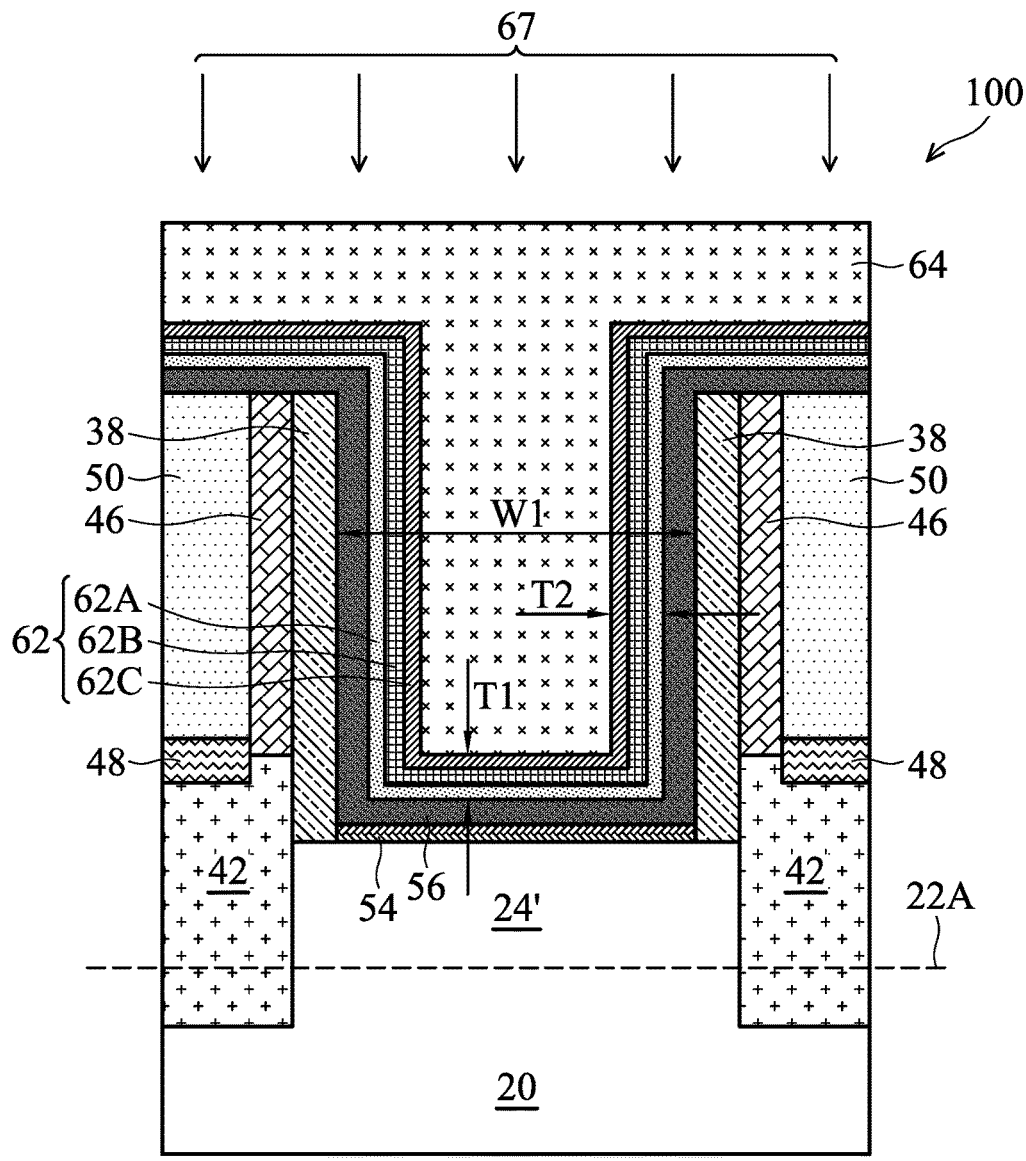

Referring to FIG. 10, metal-containing conductive layer 62 is formed through deposition. The respective step is illustrated as step 214 in the process flow shown in FIG. 22. The deposition may be performed using a conformal deposition method such as ALD or CVD, so that the horizontal thickness T1 of the horizontal portions and vertical thickness T2 of vertical portions of metal-containing layer 62 (and each of sub-layers) have thicknesses substantially equal to each other. For example, horizontal thickness T1 and vertical thickness T2 may have a difference smaller than about 20 percent or 10 percent of thickness T1. In accordance with some embodiments of the present disclosure, ratio T1/W1 may be smaller than about ¼, and in the range between about 1/10 and about ⅕, wherein W1 is the width of opening 47 (FIG. 8). For example, thickness T1 may be in the range between about 15 Å and about 30 Å, and width W1 of opening 47 may be in the range between about 150 Å and about 250 Å. Metal-containing layer 62 extends into opening 47, and includes some portions over ILD 46.

Metal-containing layer 62 includes at least one layer, and may include a plurality of layers (such as 62A, 62B, and 62C) formed of different materials. The specific material of the layers in metal-containing layer 62 may be selected according to whether the respective FinFET is an n-type FinFET or a p-type FinFET. For example, when the FinFET is an n-type FinFET, layers 62A, 62B, and 62C may include a titanium nitride (TiN) layer, a tantalum nitride (TaN) layer, and a titanium aluminum (TiAl) layer, respectively. When the FinFET is a p-type FinFET, layers 62A, 62B, and 62C may include a TiN layer, a TaN layer, and another TiN layer, respectively. In accordance with some embodiments of the present disclosure, layer 62 includes layer 62A but not layers 62B and 62C, or may include layers 62A and 62B but not layer 62C. Layer 62 may also include more than three layers.

After the deposition of metal-containing layer 62, sacrificial layer 64 is formed to fill the remaining portions of opening 47 (FIG. 10). In accordance with some embodiments, sacrificial layer 64 is formed of a photo resist. In accordance with alternative embodiments, sacrificial layer 64 is formed of another material that is different from the materials of the underlying layers 56 and 62 (62A, 62B, and 62C). For example, sacrificial layer 64 may be formed of silicon oxide, silicon nitride, silicon carbide, or the like. Sacrificial layer 64 may have a substantially planar top surface, which is caused by spin coating when sacrificial layer 64 is formed of a photo resist. A planarization step such as CMP may be performed if needed.

FIG. 10 also illustrates the etch-back of sacrificial layer 64, which is symbolized by arrows 67. The respective step is illustrated as step 216 in the process flow shown in FIG. 22. The etching may include a dry etch and/or a wet etch. Furthermore, the etch may be isotropic or anisotropic. In accordance with some embodiments of the present disclosure, the etch-back is performed using an etchant that attacks sacrificial layer 64 and metal-containing layer 62, but doesn't attack high-k dielectric layer 56.

Figure 11:
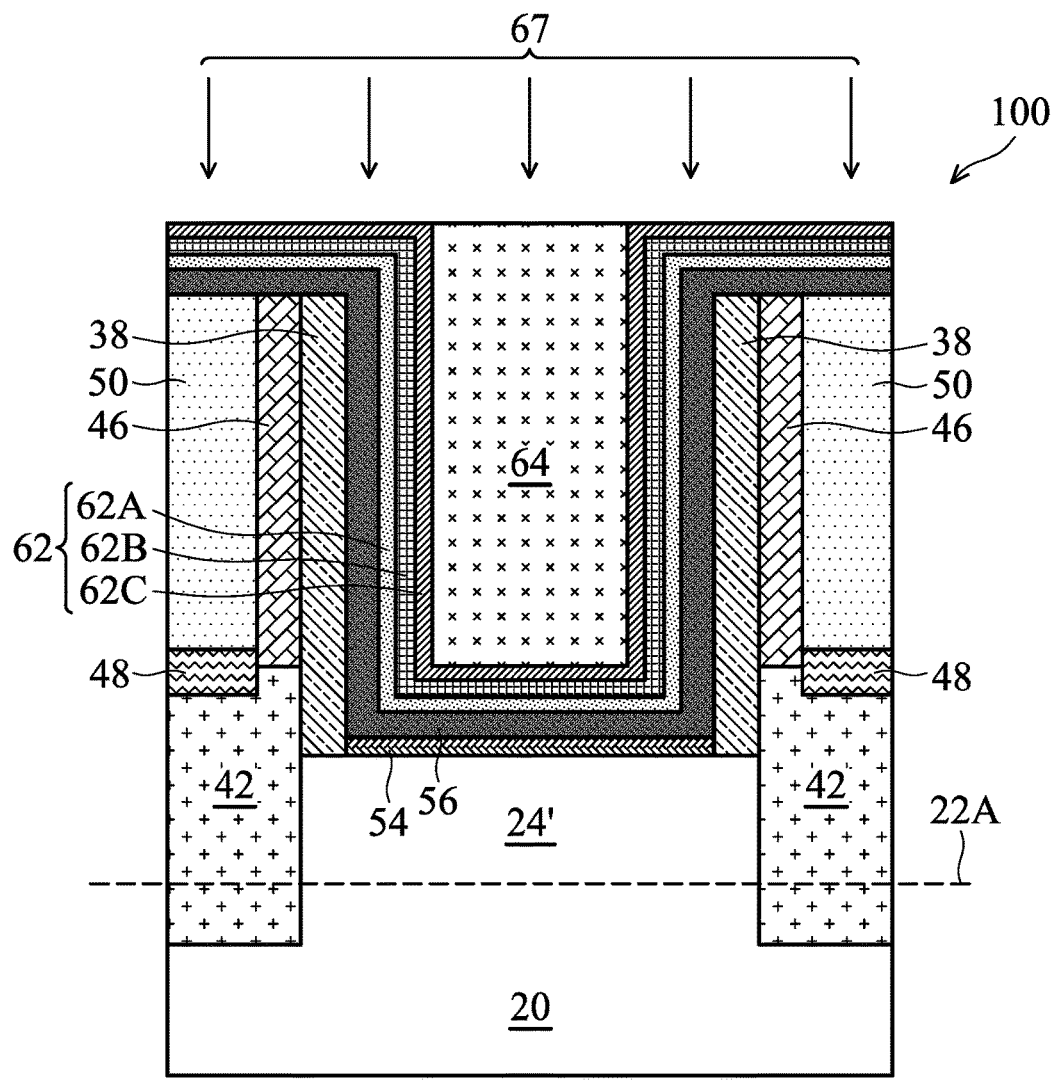
Figure 12:
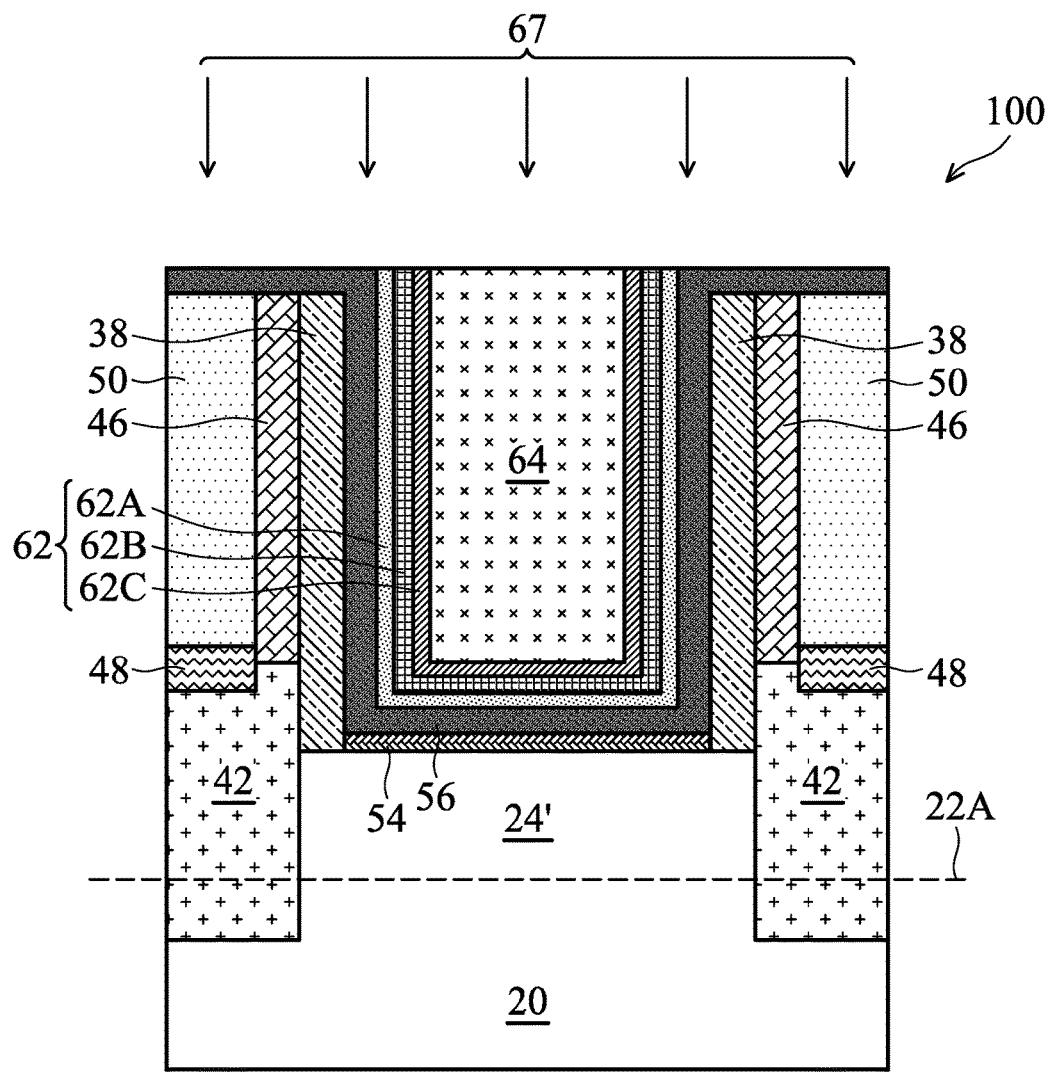

FIG. 11 illustrates an intermediate step of the etching, wherein sacrificial layer 64 is etched back, and hence layer 62 is exposed. Next, as shown in FIG. 12, the etch-back is continued, during which, both sacrificial layer 64 and metal-containing layer 62 are etched. As a result, high-k dielectric layer 56 is exposed. In accordance with some embodiments of the present disclosure, high-k dielectric layer 56 is used as an etch stop layer for the etching. Accordingly, the exposed horizontal portions of high-k dielectric layer 56 are not etched in subsequent etch-back process. High-k dielectric layer 56 thus protects the underlying structure including gate spacers 38, ILD 46, and metal contact plugs 50.

Figure 13:
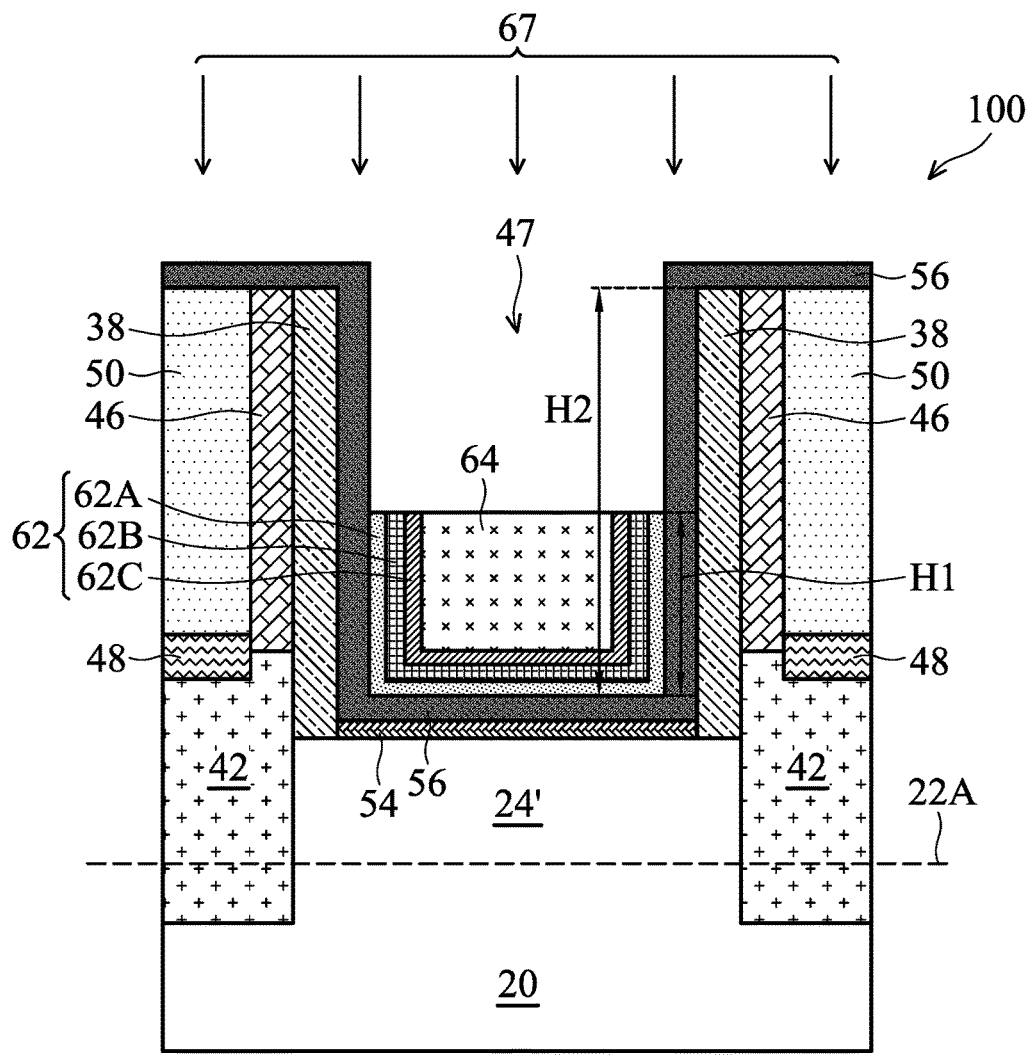

FIG. 13 illustrates a resulting structure after the etch-back is finished. Since the etchant attacks both sacrificial layer 64 and metal-containing layer 62, during the etch-back, the top surfaces of both sacrificial layer 64 and metal-containing layer 62 are lowered. It is appreciated that the etching rate of sacrificial layer 64 may be different from that of metal-containing layer 62, which causes the top surface of the remaining sacrificial layer 64 to be higher than or lower than the top edges of the remaining metal-containing layer 62. The recessing depth (H2−H1) of metal-containing layer 62 is greater than about 10 Å, greater than about 40 Å, or in the range between about 40 Å and about 450 Å, wherein H1 is the height of the remaining metal-containing layer 62, and H2 is the height/depth of opening 47. In accordance with some embodiments of the present disclosure, ratio H1/H2 is smaller than about 0.8, and may be in the range between about 0.3 and about 0.8. For example, height H2 may be in the range between about 150 Å and about 500 Å, and height H1 may be in the range between about 45 Å and about 400 Å.

Figure 14A:
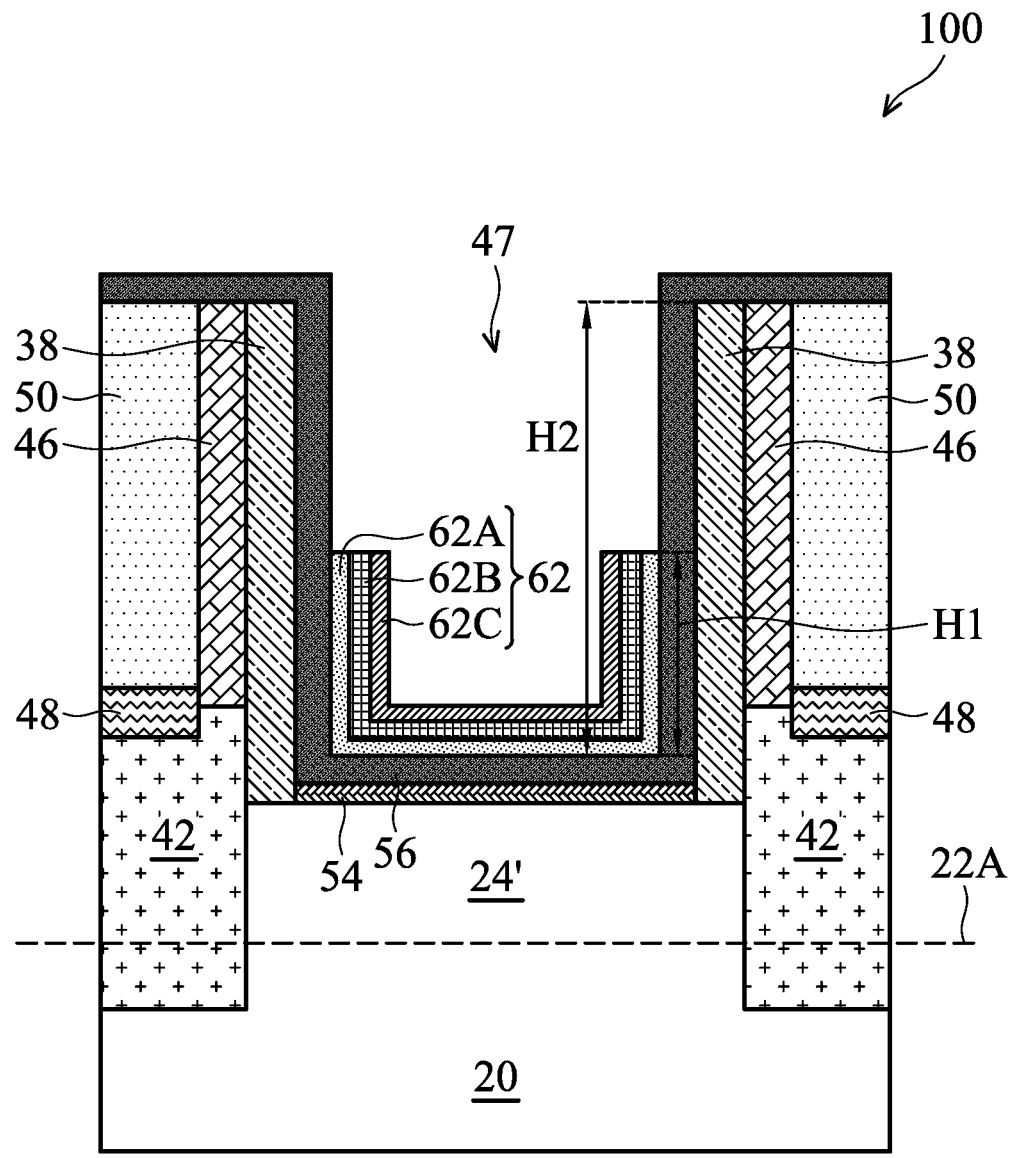
Figure 14B:
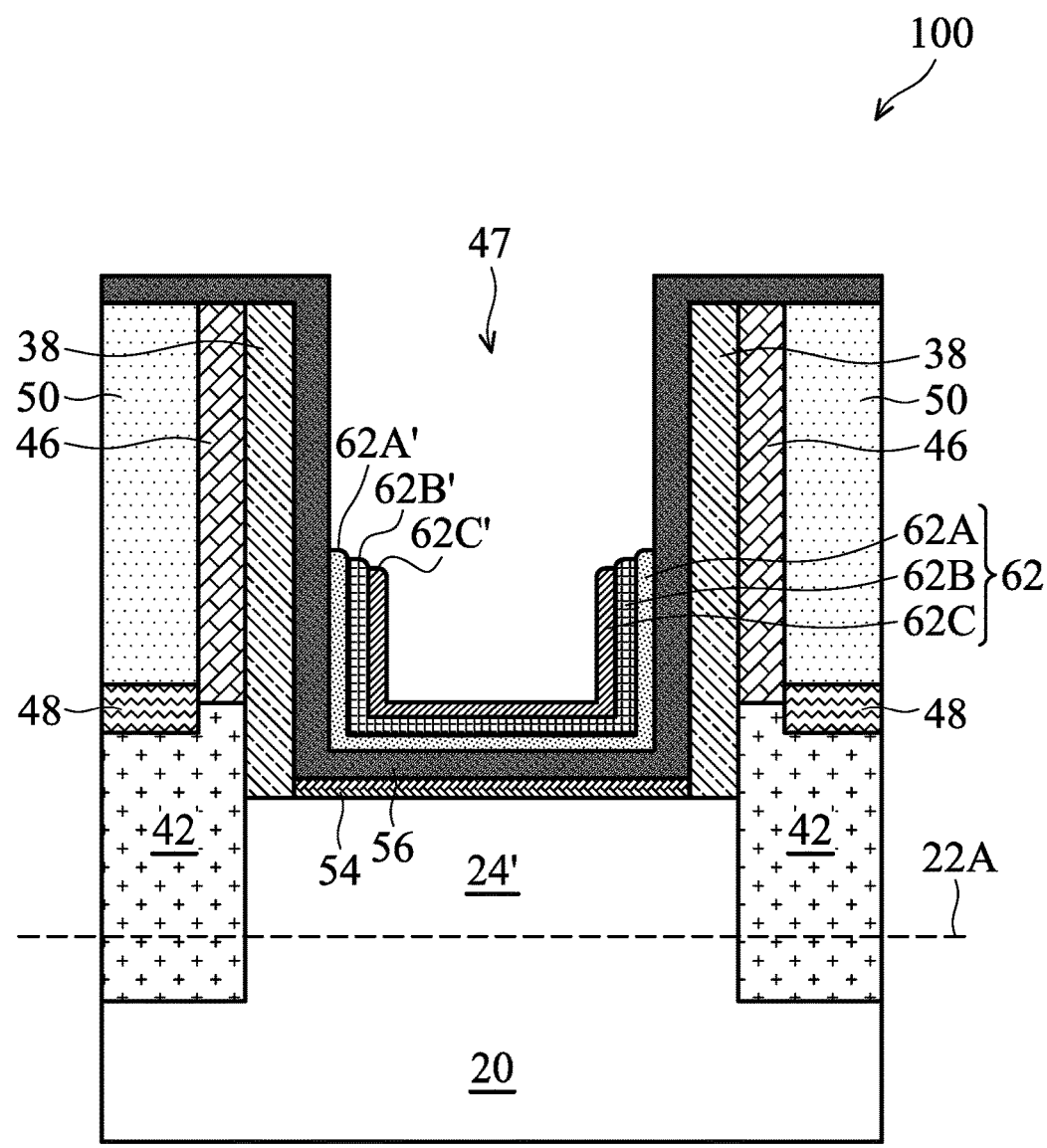

After the etch-back is finished, the remaining portion of sacrificial layer 64 is removed, for example, in a wet etch process or an ashing process. FIG. 14A illustrates a resulting structure in accordance with some embodiments. Due to the material difference of layers 62A, 62B, and 62C, the top edges of layers 62A, 62B, and 62C may be at the same level or at different levels, depending on the materials of layers 62A, 62B, and 62C, the selected etchant, and the etching process conditions (such as temperature, pressure, concentration, etc.). Accordingly, the top edges 62A', 62B', and 62C' of layers 62A, 62B, and 62C, respectively, may be level with, higher than, or lower than the other ones of layers 62A, 62B, and 62C in any combination (refer to FIGS. 21A through 21D, for example). FIG. 14B illustrates the resulting layers 62A, 62B, and 62C in accordance with some exemplary embodiments, wherein upper layers of 62A, 62B, and 62C have top edges 62A', 62B', and 62C' increasingly lower than the respective lower layers of 62A, 62B, and 62C. This may be achieved by performing the etch-back using an etchant that has the relationship ER64≥ER62C≥ER62B≥ER62A, wherein ER64, ER62C, ER62B, and ER62A are the etching rates of sacrificial layer 64, layer 62C, layer 62B, and layer 62A, respectively. The profile shown in FIG. 14B is advantageous since the bottom portions of opening 47 are increasingly narrower than the upper portions, and it is easy to fill opening 47 without generating seam in the filling material. FIG. 14B also illustrates that top edges 62A', 62B', and 62C' form some steps.

Figure 15:
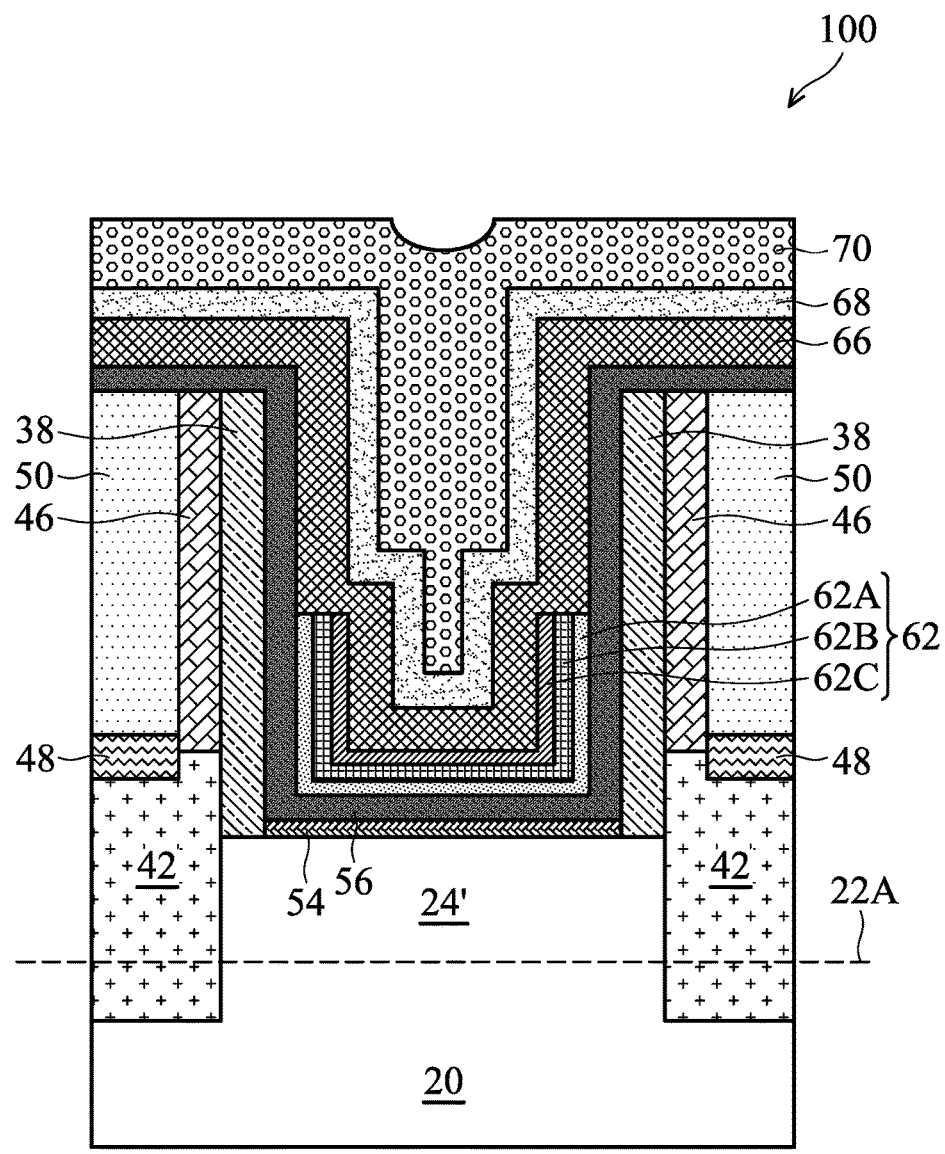

The remaining opening 47 as shown in FIG. 14A or 14B is then filled with conductive (which may be metal-containing) materials, as shown in FIG. 15 in accordance with some embodiments. The respective step is illustrated as step 218 in the process flow shown in FIG. 22. In accordance with some exemplary embodiments, the filling metal includes metal layer 66, metal layer 68, and metal layer 70. At least metal layer 66 is a work-function metal, and metal layers 68 and metal layer 70 may be non-work-function metals or work-function metals. Throughout the description, when a metal layer is referred to as a work-function metal, it indicates it has a work function fits the type of the respective FinFET, and its location in the metal gate allows its work function to affect or determine the work function of the respective FinFET. For example, when the FinFET is an n-type FinFET, the work-function metal preferably has a low work function, which is lower than the mid-gap work function (about 4.5 eV). The work function of the respective work-function metal may be referred to as an n-work function, which is lower than about 4.3 eV, and may be in the range between about 3.9 eV and about 4.3 eV. When the FinFET is a p-type FinFET, the work-function metal has a high work function, which is higher than the mid-gap work function. The work function of the respective work-function metal may be referred to as a p-work function, which is higher than about 4.5 eV, and may be in the range between about 4.7 eV and about 5.1 eV.

In accordance with some embodiments of the present disclosure, metal-containing layer 66 may include TiAl when the FinFET is an n-type FinFET, and may include TiN when the FinFET is a p-type FinFET. When the FinFET is an n-type FinFET, layers 68 and 70 may include a TiN layer/cobalt layer, and a tungsten layer or an aluminum layer in accordance with some embodiments. When the FinFET is a p-type FinFET, layers 68 and 70 may include a TiAl layer, a TiN layer, a cobalt layer, and a tungsten layer or an aluminum layer in accordance with some embodiments. Layers 66, 68, and 70 may be formed using Physical Vapor Deposition, ALD, CVD, or the like.

Figure 16:
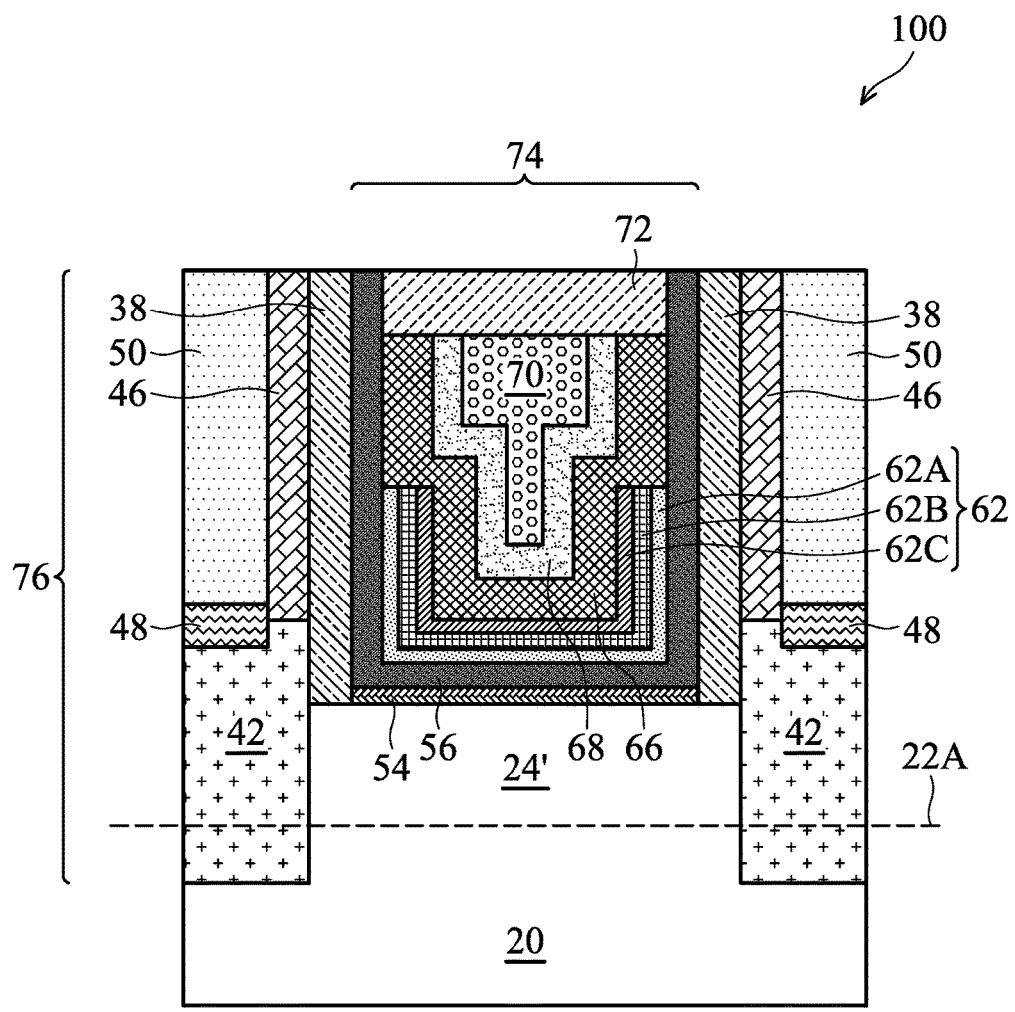

Next, a planarization step (for example, a CMP) is performed to remove the excess portions of layers 66, 68, and 70 over ILD 46. The respective step is illustrated as step 220 in the process flow shown in FIG. 22. The horizontal portions of high-k dielectric layer 56 over ILD 46 are also removed. The remaining portions of layers 54, 56, 62, 66, 68, and 70 in combination form replacement gate stack 74. Each of the remaining portions of layers 56, 62, 66, and 68 includes a bottom portion, and sidewall portions over and connected to the bottom portion. FinFET 76 is thus formed. Next, as shown in FIG. 16, metal layers 66, 68, and 70 are recessed, and the corresponding recess is filled with hard mask 72, which is a dielectric hard mask formed of silicon nitride, silicon oxynitride, silicon oxy-carbide, or the like. Hard mask 72 is also planarized so that its top surface is coplanar with the top surface of ILD 46.

In the illustrated embodiments, source/drain contact plugs 50 are formed before the formation of replacement gate stack 74. In accordance with alternative embodiments of the present disclosure, source/drain contact plugs 50 are formed after the formation of replacement gate stack 74.

Figure 17:
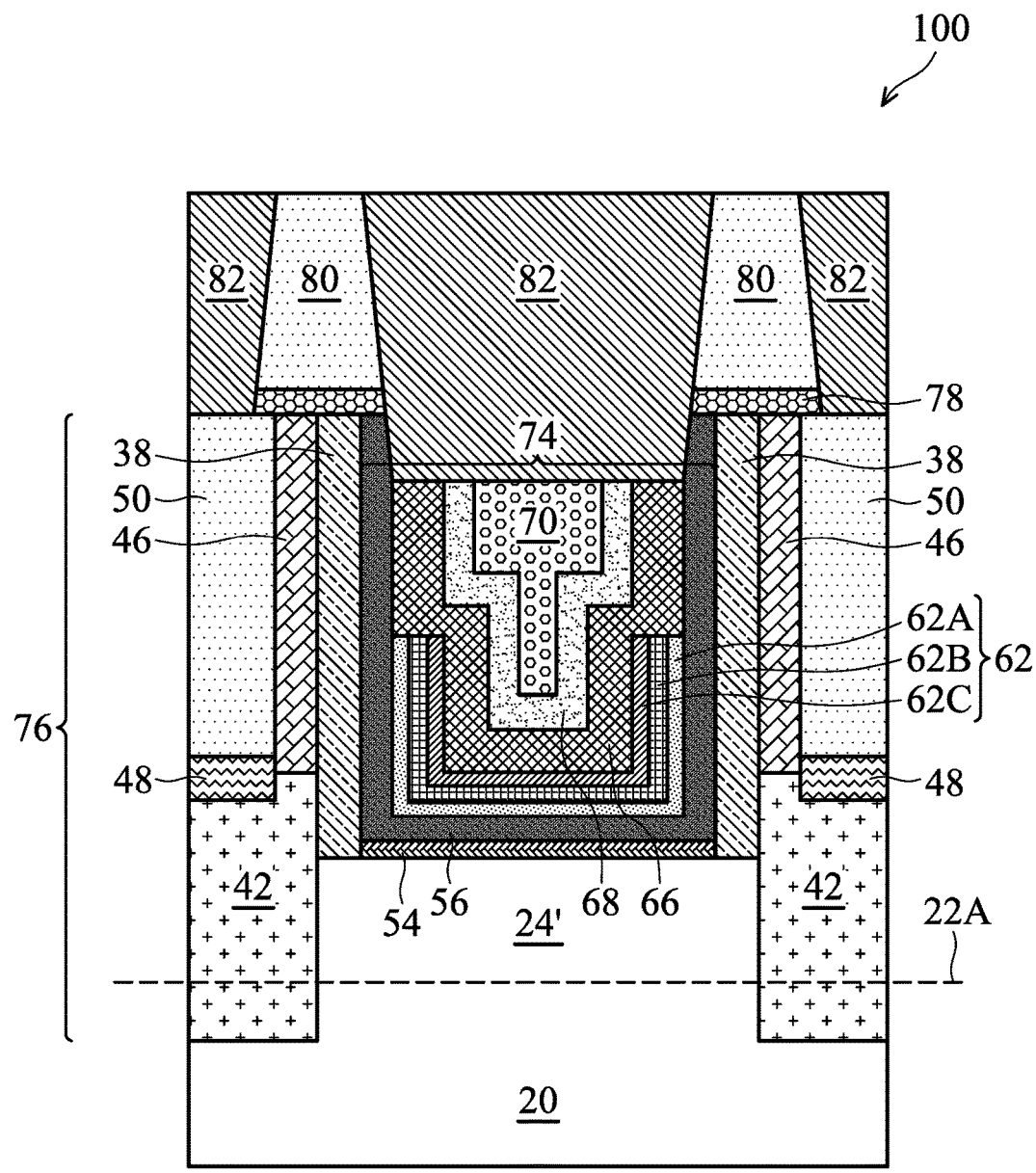

Referring to FIG. 17, etch stop layer 78 is formed over replacement gate stack 74. Etch stop layer 78 is formed of a dielectric material, which may include silicon carbide, silicon nitride, silicon oxynitride, or the like. ILD 80 is formed over Etch stop layer 78, and contact plugs 82 are formed in ILD 80. The formation process may include forming contact plug openings in ILD 80 to expose replacement gate stack 74 and source/drain contact plugs 50, and filling the contact plug openings with a conductive material to form contact plugs 82. In the illustrated plane, hard mask 72 (FIG. 16) is also removed, so that gate contact plug 82 extends into the recess left by the removed hard mask 72.

Figure 18:
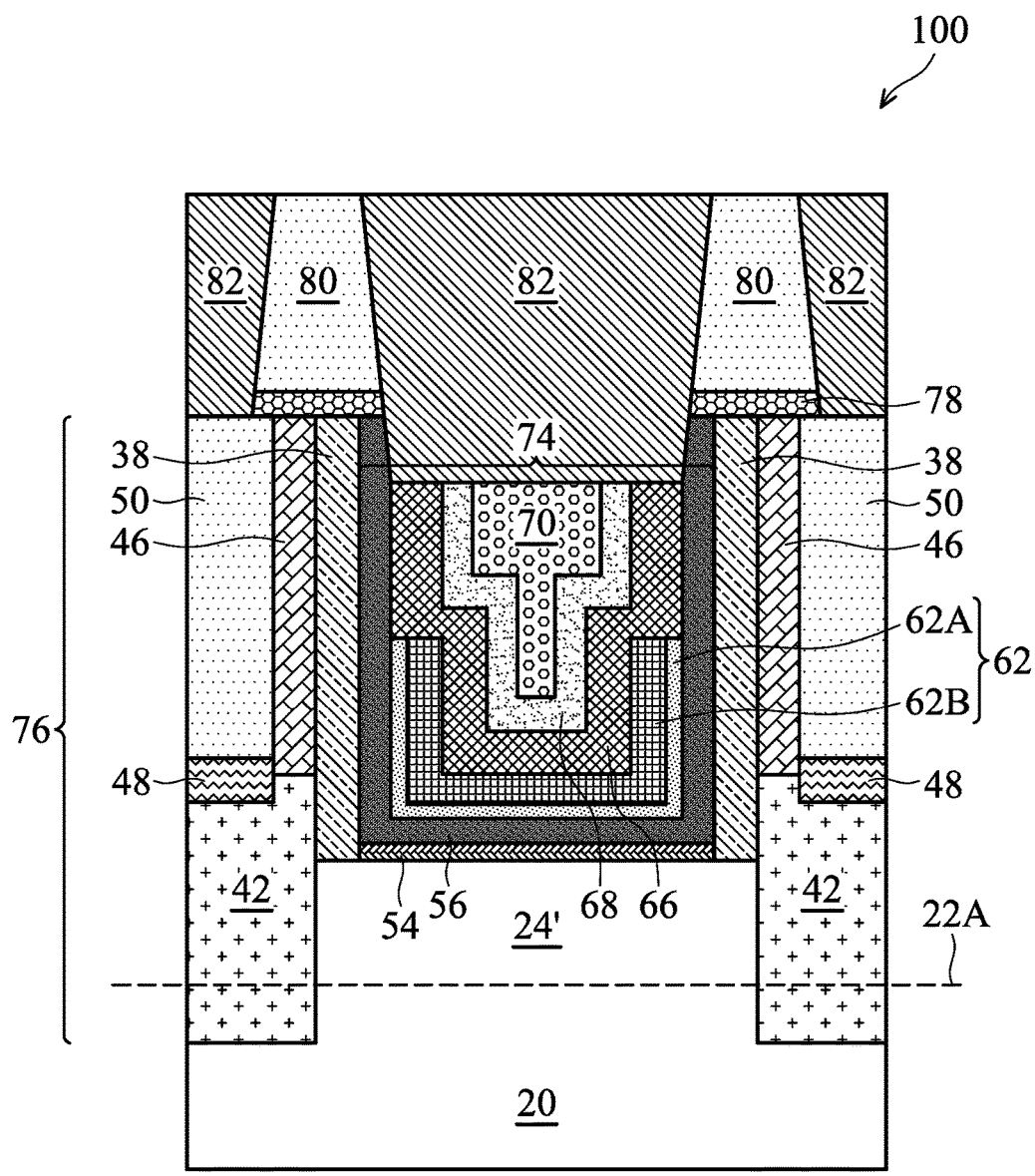
FIGS. 18 through 20 illustrate the cross-sectional views of FinFETs in accordance with some embodiments, wherein the cross-sectional views are obtained from channel-length directions of the FinFETs.

FIG. 18 illustrates FinFET 76 in accordance with some embodiments, wherein metal-containing layer 62 includes layers 62A and 62B, and doesn't include layer 62C as shown in FIG. 17. In accordance with some embodiments, the FinFETs shown in FIGS. 17 and 18 are different types of FinFETs formed on a same substrate 20. For example, the FinFET shown FIG. 17 may be a p-type FinFET, and the FinFET shown in FIG. 18 may be an n-type FinFET. In accordance with some embodiments, the replacement gate stacks in FIGS. 17 and 18 have the same widths W1.

Figure 19:
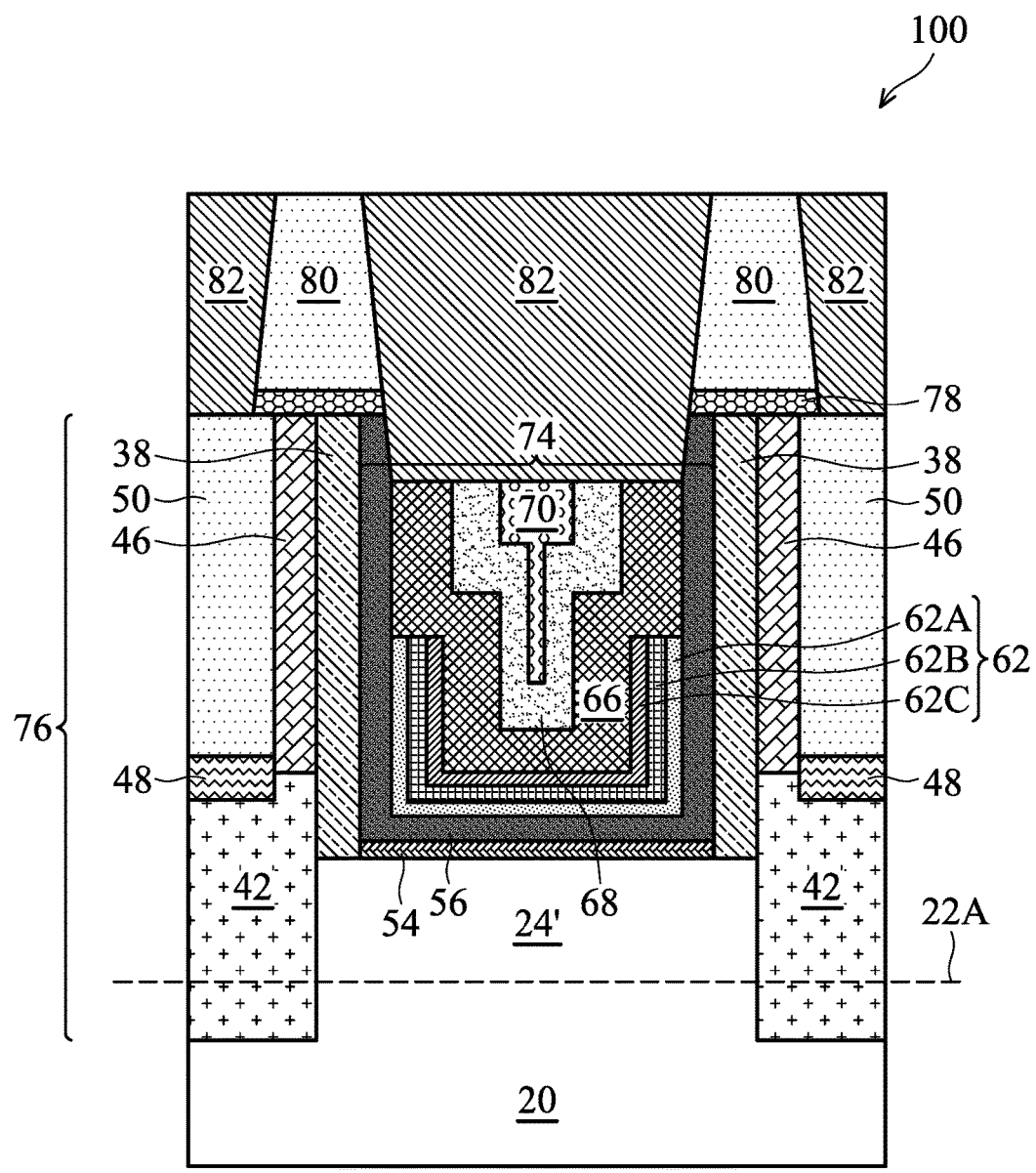
Figure 20:
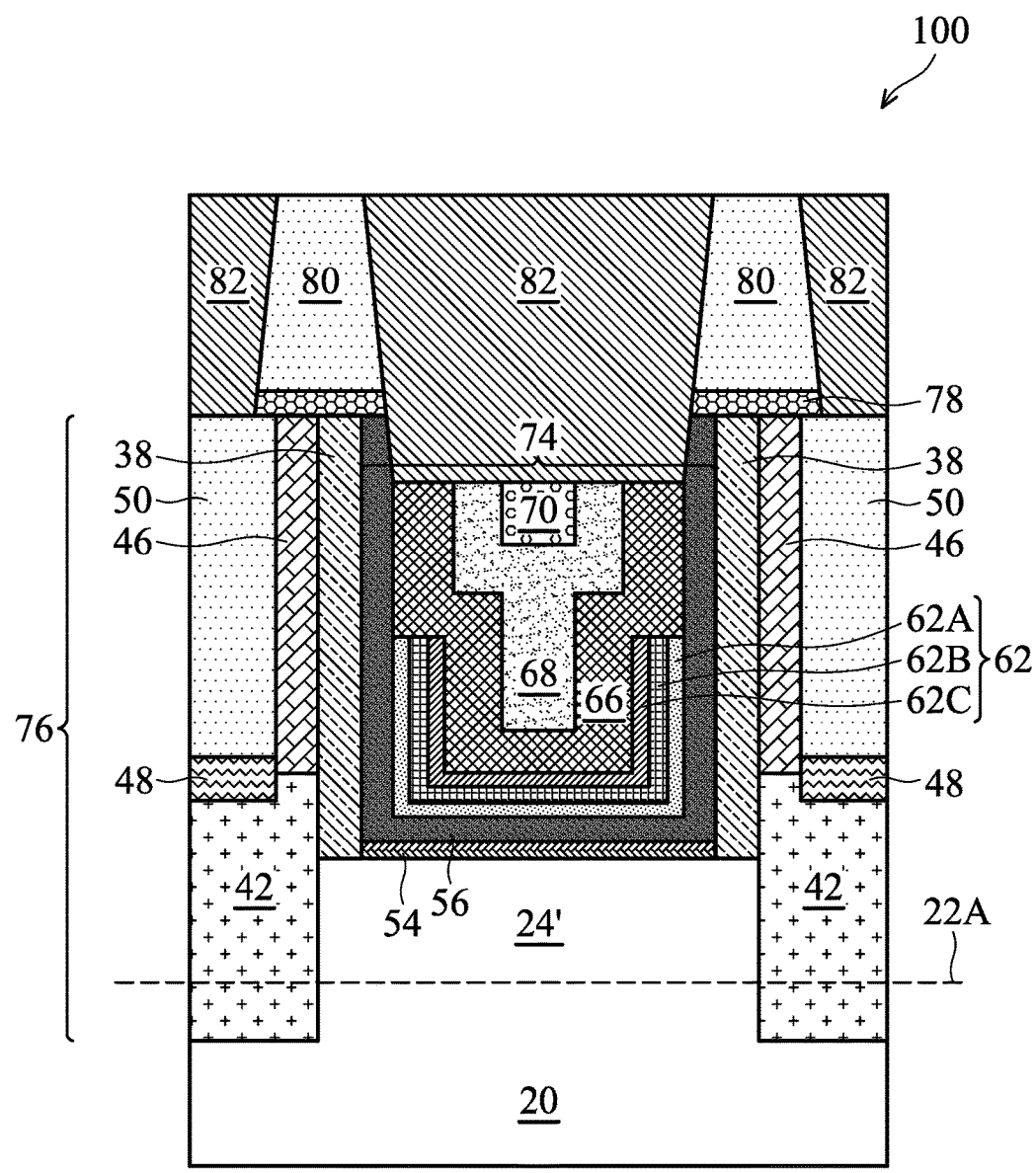

FIGS. 19 and 20 illustrate that the change in the thicknesses of metal layers and/or the change in width W1 causes the change in the shapes of metal layer 70. For example, as shown in FIG. 19, when the thickness of layer 68 is increased, the widths of metal layer 70 are reduced. Further increasing the thickness of layer 66, layer 68 and/or layer 62, metal-containing layer 70 will only have portions higher than the top edges of metal-containing layer 62, and will not have portions extending below the top edges of metal-containing layer 62. In accordance with some embodiments of the present disclosure, the structure shown in FIG. 19 may be adopted by an n-type FinFET, and the structure shown in FIG. 20 may be adopted by a p-type FinFET, wherein the p-type FinFET and the n-type FinFET are formed on the same substrate.

Figure 21A:
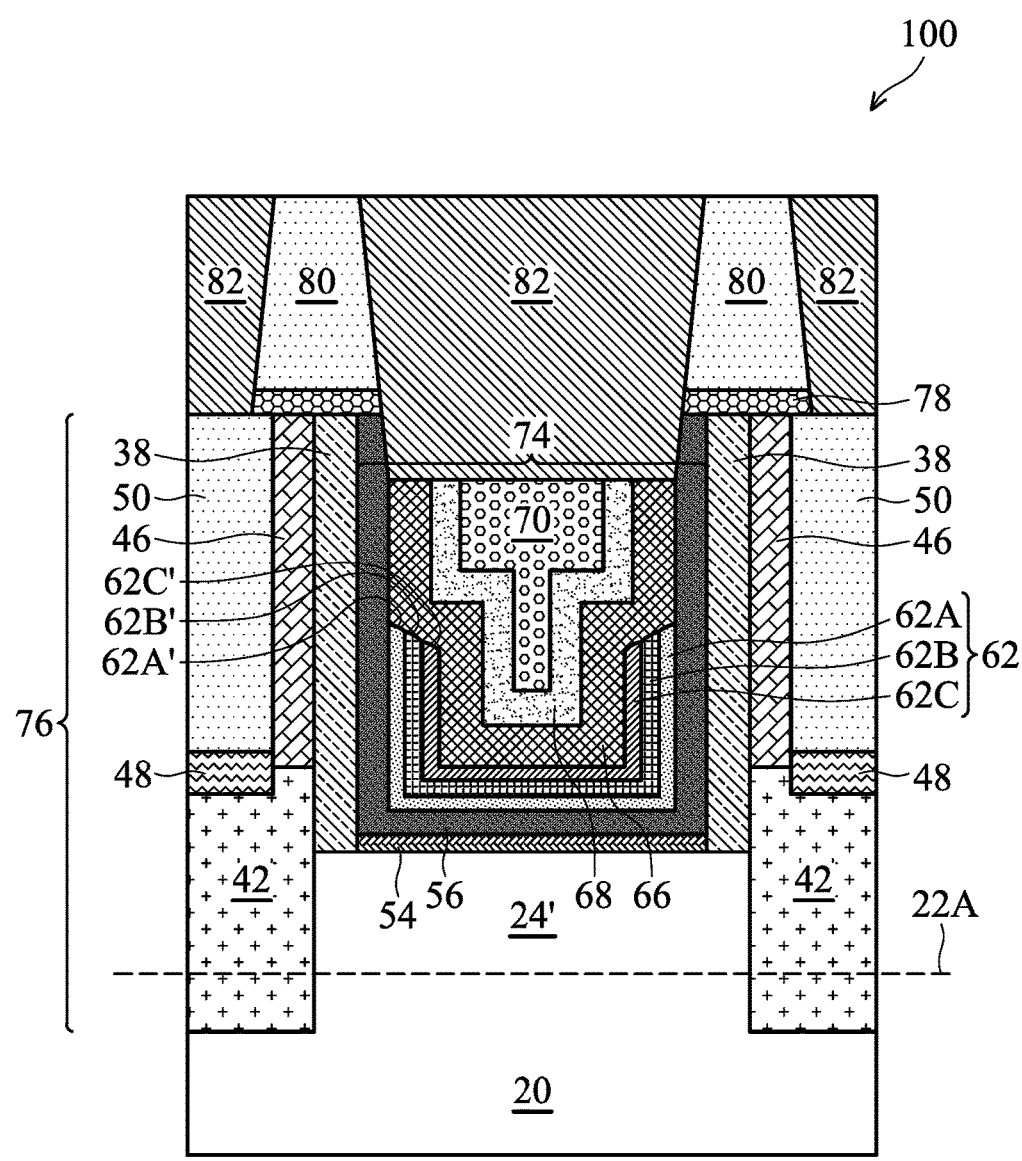
FIGS. 21A, 21B, 21C, and 21D are cross-sectional views of FinFETs in accordance with some embodiments, wherein the top ends of metal layers have different heights and shapes.
Figure 21B:
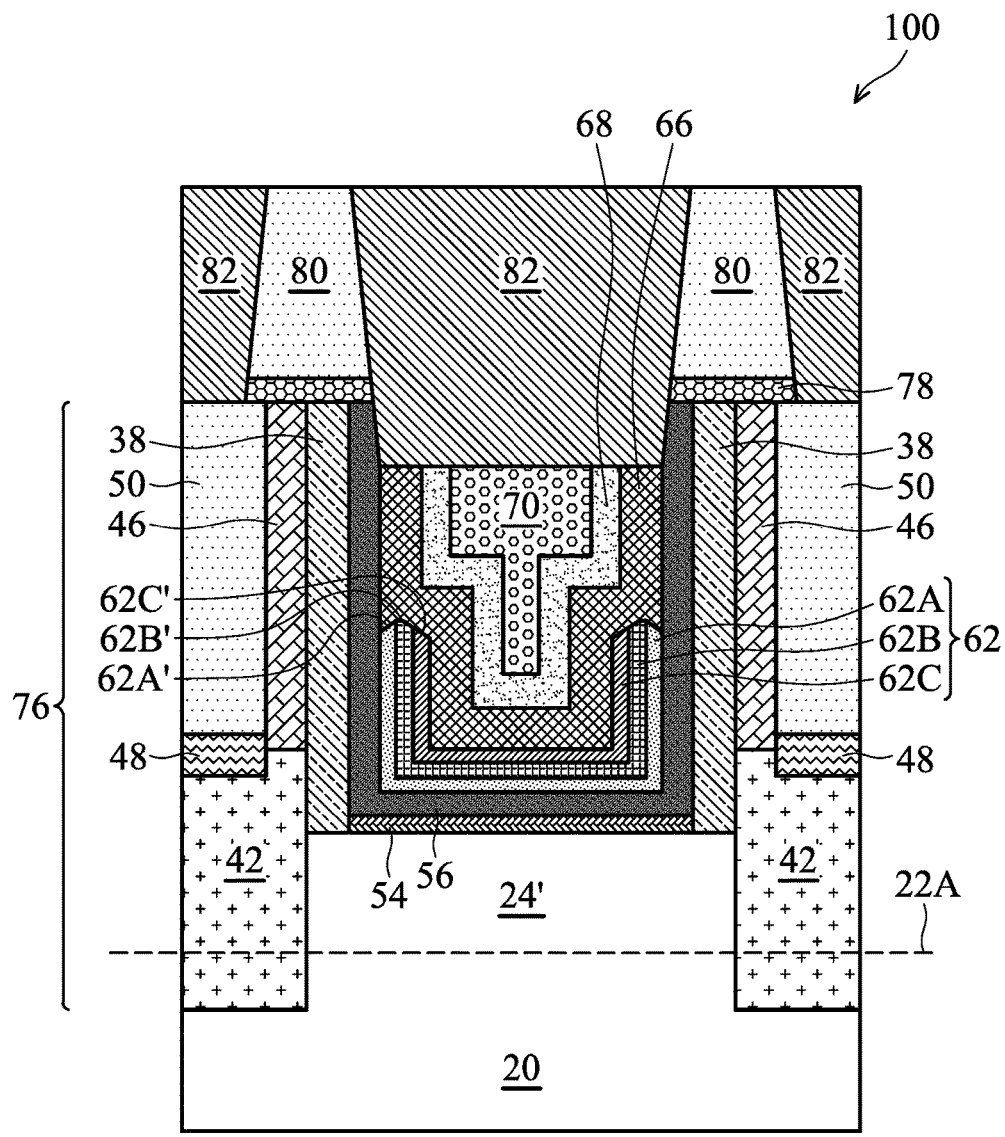
Figure 21C:
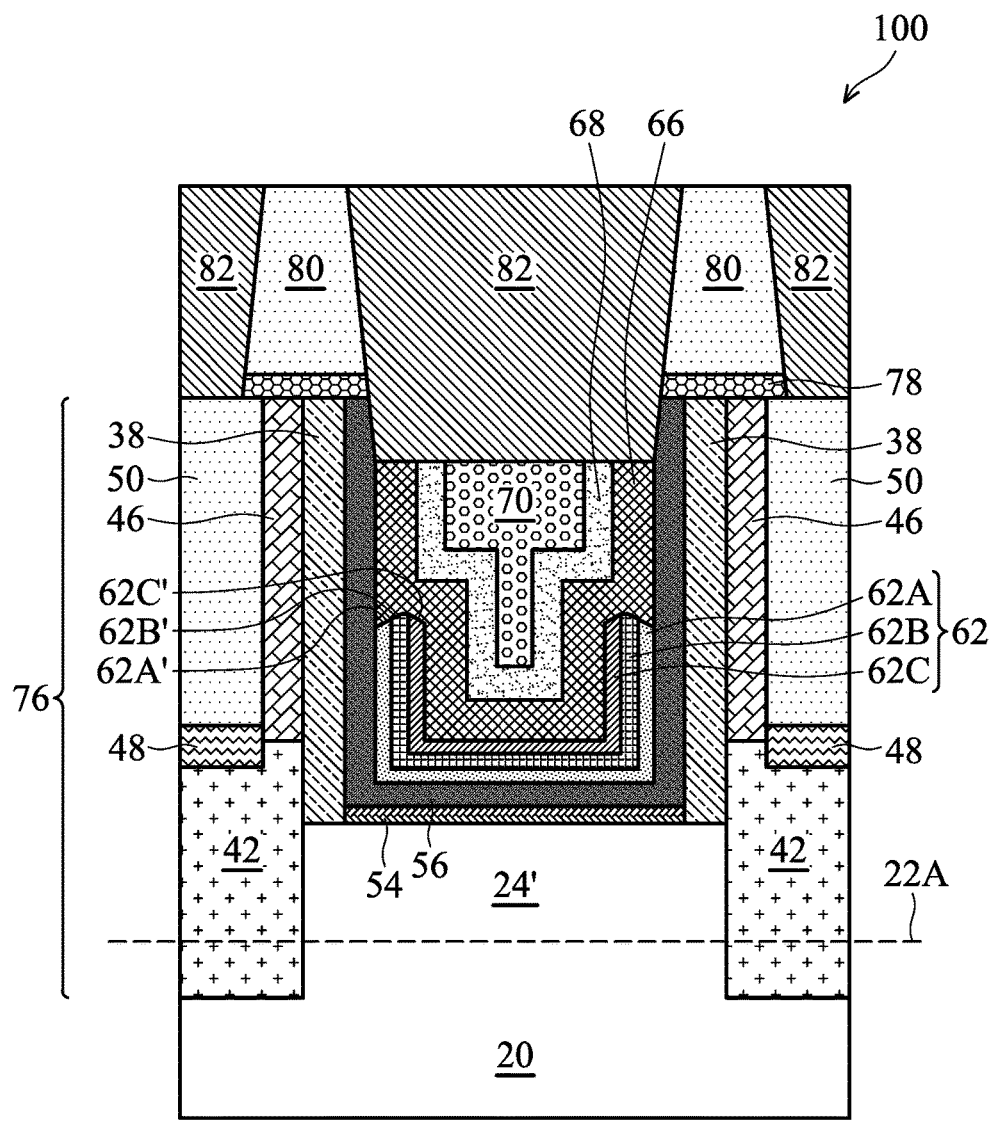
Figure 21D:
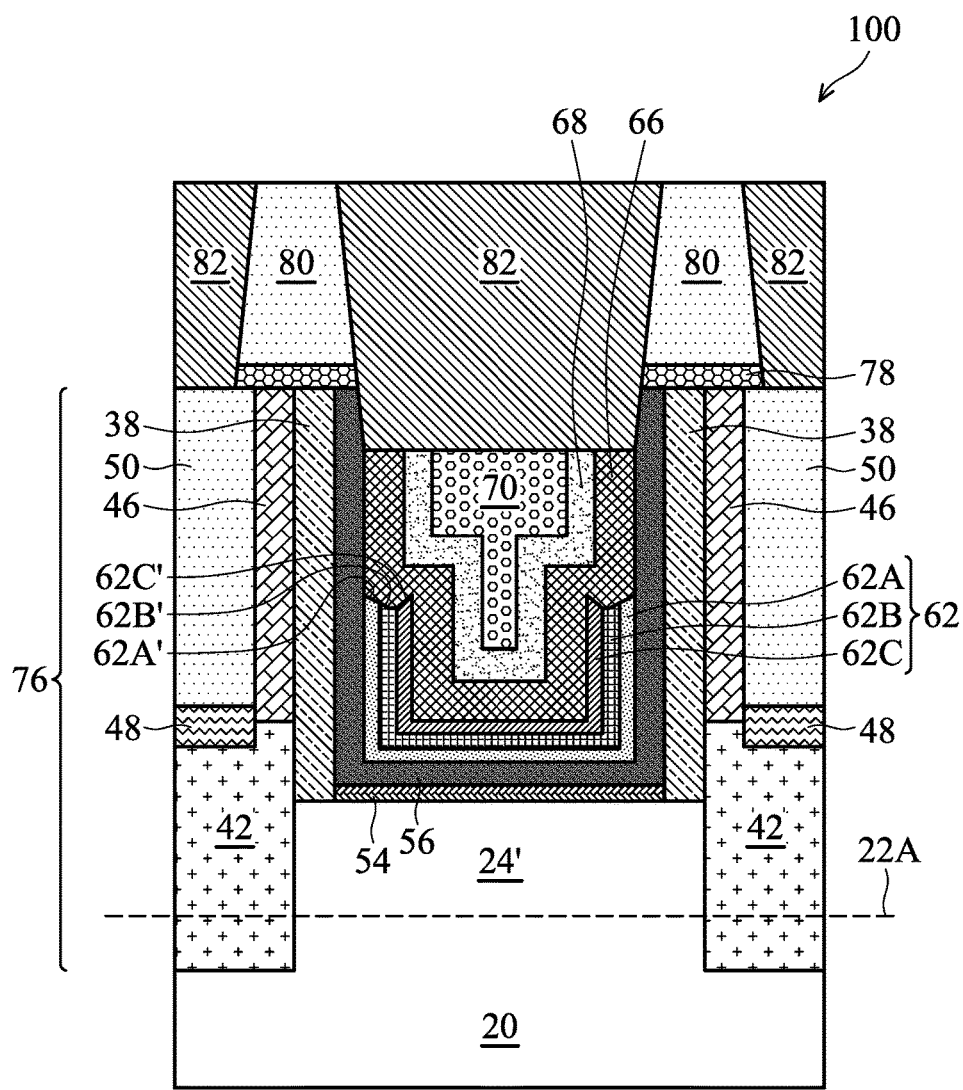

In FIG. 17, the details of the top edge profiles of layers 62A, 62B, and 62C are not illustrated. FIGS. 21A, 21B, 21C, and 21D illustrate the top-edge profile of layers 62A, 62B, and 62C in accordance with some embodiments. As discussed in preceding paragraphs, by adjusting the etching rates ER64, ER62C, ER62B, and ER62A of sacrificial layer 64 and layers 62C, 62B, and 62A, top edges 62A', 62B', and 62C' may have different heights and shapes. For example, as shown in FIG. 21A, top edges 62A', 62B', and 62C' may form a continuously dropping edge, with no step formed. In FIG. 21B, top edges 62A' and 62C' are lower than top edge 62B', with a highest point of the top edges being a portion of top edge 62B'. In FIG. 21C, top edge 62B' is higher than top edge 62C', which is further higher than top edge 62A'. In FIG. 21D, top edge 62B' is lower than top edges 62A' and 62C', wherein top edge 62A' may be higher than or lower than top edge 62C'. It is also noted that the top-edge profiles of top edges 62A', 62B', and 62C' may also be combined with the profiles of layer 66, 68, and 70 as shown in FIGS. 18 through 20 in any combination.

The embodiments of the present disclosure have some advantageous features. By forming one or more metal-containing layer and then performing an etch-back, the bottoms of the recesses for forming replacement gates are narrowed. The gate gap-filling thus becomes easier, and the seams that otherwise may be generated in metal-containing layer 70 is eliminated. This advantageously improves the production yield. Also, the leakage paths that may be caused by the seams are also eliminated.

In accordance with some embodiments of the present disclosure, a method includes forming a dummy gate stack over a semiconductor region, forming a dielectric layer at a same level as the dummy gate stack, removing the dummy gate stack to form an opening in the dielectric layer, filling a metal layer extending into the opening, and etching back the metal layer, with remaining portions of the metal layer having edges lower than a top surface of the dielectric layer. The opening is filled with a conductive material, and the conductive material is over the metal layer. The metal layer and the conductive material in combination form a replacement gate. A source region and a drain region are formed on opposite sides of the replacement gate.

In accordance with some embodiments of the present disclosure, a method includes forming a dummy gate stack on a semiconductor region, forming gate spacers on sidewalls of the dummy gate stack, and forming source and drain regions on opposite sides of the dummy gate stack, The method further includes forming an inter-layer dielectric to cover the source and drain regions, removing the dummy gate stack to form an opening, forming a gate dielectric layer extending into the opening, and forming a metal-containing layer over the gate dielectric layer. The metal-containing layer has a first portion in the opening, and a second portion outside of the opening. The method further includes removing the second portion and etching back the first portion of the metal-containing layer, and filling remaining opening with a conductive material.

In accordance with some embodiments of the present disclosure, a device includes gate spacers, an opening between the gate spacers, a gate dielectric lining the opening, and a metal-containing layer over a bottom portion of the gate dielectric. The metal-containing layer has a bottom portion at a bottom of the opening, and sidewall portions connected to ends of the bottom portion. Top edges of the sidewall portions are lower than top edges of the gate spacers. A conductive material is located over the metal-containing layer and in the opening. The conductive material has a top surface higher than the top edges of the sidewall portions of the metal-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate stack over a semiconductor region;
   forming a dielectric layer at a same level as the dummy gate stack;
   removing the dummy gate stack to form an opening in the dielectric layer;
   forming a plurality of metal layers extending into the opening, wherein the plurality of metal layers are formed of different materials, and the plurality of metal layers comprise a bottom layer, a middle layer over the bottom layer, and a top layer over the middle layer;
   forming a sacrificial layer over the plurality of metal layers, wherein the sacrificial layer is filled into the opening; and
   etching back the plurality of metal layers, wherein remaining portions of the plurality of metal layers have edges lower than a top surface of the dielectric layer, wherein after the etching back, the plurality of metal layers have slanted top surfaces, and a top edge of the middle layer has a topmost point higher than top edges of the bottom layer and the top layer;
   filling the opening with a conductive material, wherein the conductive material is over the plurality of metal layers, wherein the metal layer and the conductive material in combination form a replacement gate; and
   forming a source region and a drain region, wherein the source region and the drain region are on opposite sides of the replacement gate.

2. The method of claim 1, wherein the filling the sacrificial layer comprises applying a photo resist.

3. The method of claim 1, wherein the plurality of metal layers comprise a work-function layer.

4. The method of claim 1, wherein the plurality of metal layers are etched to have a remaining height smaller than about 80 percent of a depth of the opening.

5. The method of claim 1 further comprising forming gate spacers on opposite sides of the dummy gate stack.

6. A method comprising:
   forming a dummy gate stack on a semiconductor region;
   forming gate spacers on sidewalls of the dummy gate stack;
   forming source and drain regions on opposite sides of the dummy gate stack;
   forming an inter-layer dielectric to cover the source and drain regions;
   removing the dummy gate stack to form an opening;
   forming a gate dielectric layer extending into the opening;
   forming a plurality of metal-containing layers over the gate dielectric layer, wherein the plurality of metal-containing layers comprises a first portion in the opening, and a second portion outside of the opening;
   forming a sacrificial layer over the metal-containing layer, wherein the sacrificial layer is filled into the opening;
   removing the second portion and etching back the first portion of the plurality of metal-containing layers, wherein the sacrificial layer is etched simultaneously when the plurality of metal-containing layers are etched back, and after the etching back, at least one of the plurality of metal-containing layers has a top surface, and the top surface has inner portions being increasingly lower than respective outer portions, and the inner portions are closer to a center line of the opening than the outer portions; and
   filling remaining opening with a conductive material.

7. The method of claim 6, wherein the forming the plurality of metal-containing layers comprises depositing a plurality of metal layers comprising a work-function layer.

8. The method of claim 6, wherein the forming the plurality of metal-containing layers is performed using atomic layer deposition.

9. The method of claim 6, wherein the removing the second portion is performed by etching.

10. The method of claim 6 further comprising, after etching the plurality of metal-containing layers, removing remaining portions of the sacrificial layer.

11. A device comprising:
gate spacers;
an opening between the gate spacers;
a gate dielectric lining the opening;
a metal-containing layer over a bottom portion of the gate dielectric, wherein the metal-containing layer comprises a bottom portion at a bottom of the opening, and sidewall portions connected to ends of the bottom portion, wherein top edges of the sidewall portions are lower than top edges of the gate spacers, wherein the metal-containing layer comprises:
a plurality of metal layers formed of different materials, wherein the plurality of metal layers comprise three layers, with a top edge of a middle layer in the plurality of metal layers having a topmost point higher than top edges of a lower layer under the middle layer and an upper layer over the middle layer, the top edges of the plurality of metal layers are slanted; and
a conductive material over the metal-containing layer, wherein the conductive material is in the opening, and has a top surface higher than the top edges of the sidewall portions of the metal-containing layer.

12. The device of claim 11, wherein the metal-containing layer is a substantially conformal layer, and wherein the bottom portion and the sidewall portions of the metal-containing layer have substantially a same thickness.

13. The device of claim 11, wherein the conductive material comprises a work-function metal, with the conductive material determining a work function of a respective transistor.

14. The device of claim 13, wherein the work-function metal has a top edge substantially coplanar with top edges of the gate spacers.

15. The method of claim 6, wherein the plurality of metal layers comprise a bottom layer, a middle layer over the bottom layer, and a top layer over the middle layer, and wherein a top edge of the bottom layer has a top edge lower than top edges of the middle layer and the top layer.

16. The method of claim 6, wherein plurality of metal layers comprise three layers, with a top edge of a middle layer in the plurality of metal layers having a top edge higher than top edges of a lower layer under the middle layer and an upper layer over the middle layer.

17. The method of claim 1, wherein top edges of the top layer, the middle layer, and the bottom layer continuously drop from the topmost point to locations farther away from the topmost point.

18. The device of claim 11, wherein top edges of the upper layer, the middle layer, and the lower layer continuously drop from the topmost point to locations farther away from the topmost point.

19. The method of claim 1, wherein the conductive material is in contact with each of the top layer, the middle layer, and the bottom layer.

20. The device of claim 11, wherein the conductive material is in contact with each of the upper layer, the middle layer, and the lower layer.

* * * * *